(12) United States Patent
Tsuboi

(10) Patent No.: US 11,527,595 B2
(45) Date of Patent: Dec. 13, 2022

(54) LIGHT EMITTING APPARATUS, IMAGING APPARATUS, ELECTRONIC APPARATUS, ILLUMINATION APPARATUS, AND MOBILE APPARATUS

(71) Applicant: CANON KABUSHIKI KAISHA, Tokyo (JP)

(72) Inventor: Hiromasa Tsuboi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 51 days.

(21) Appl. No.: 17/160,852

(22) Filed: Jan. 28, 2021

(65) Prior Publication Data

US 2021/0242292 A1 Aug. 5, 2021

(30) Foreign Application Priority Data

Jan. 30, 2020 (JP) .............................. JP2020-013812

(51) Int. Cl.
| | |
|---|---|
| *G09G 3/3233* | (2016.01) |
| *G09G 3/20* | (2006.01) |
| *H01L 27/32* | (2006.01) |
| *H04N 5/225* | (2006.01) |
| *H01L 29/78* | (2006.01) |
| *F21S 43/145* | (2018.01) |
| *B60Q 1/30* | (2006.01) |
| *B60Q 1/44* | (2006.01) |

(52) U.S. Cl.
CPC ........ *H01L 27/3265* (2013.01); *F21S 43/145* (2018.01); *G09G 3/3233* (2013.01); *H01L 29/7833* (2013.01); *H04N 5/22525* (2018.08); *B60Q 1/30* (2013.01); *B60Q 1/44* (2013.01); *G09G 2300/0426* (2013.01); *G09G 2300/0819* (2013.01); *G09G 2300/0861* (2013.01); *G09G 2320/045* (2013.01)

(58) Field of Classification Search
CPC  G09G 3/2003; G09G 3/3233; H01L 27/3265; H01L 27/326
See application file for complete search history.

(56) References Cited

U.S. PATENT DOCUMENTS

| | | | | |
|---|---|---|---|---|
| 5,402,141 A | * | 3/1995 | Haim ................... | G09G 3/3607 345/95 |
| 2007/0040770 A1 | * | 2/2007 | Kim ..................... | G09G 3/3291 345/76 |

(Continued)

FOREIGN PATENT DOCUMENTS

JP   2009-223036 A   10/2009

*Primary Examiner* — Kevin M Nguyen
(74) *Attorney, Agent, or Firm* — Venable LLP

(57) ABSTRACT

A light emitting apparatus comprising a plurality of pixels with different light emitting colors, each of the plurality of pixels includes a light-emitting element configured to emit light with one of at least three different light emitting colors, a driving transistor configured to supply a current to the light-emitting element in accordance with a voltage supplied to a gate, a write transistor configured to supply a signal voltage from a signal line to the gate of the driving transistor, and a capacitance at a connection portion between the driving transistor and the write transistor, wherein the capacitance is different for each light emitting color, and is larger in a pixel of a light emitting color in which a peak current flowing through the light-emitting element is larger.

21 Claims, 32 Drawing Sheets

(56) References Cited

U.S. PATENT DOCUMENTS

2008/0238953 A1\* 10/2008 Ogura .................. G09G 3/3275
345/697
2009/0230890 A1 9/2009 Takahara \* cited by examiner

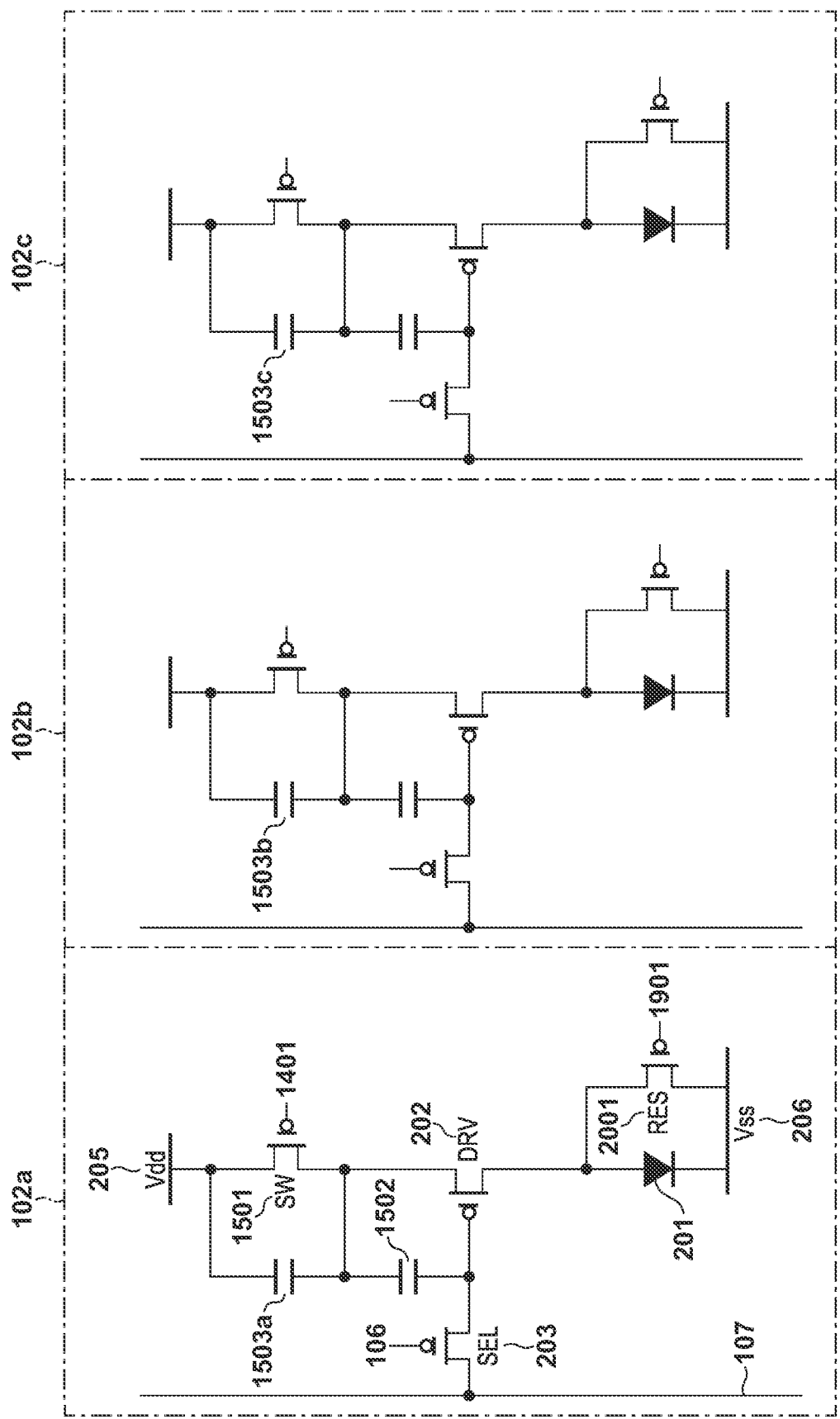

LIGHT EMITTING APPARATUS, IMAGING APPARATUS, ELECTRONIC APPARATUS, ILLUMINATION APPARATUS, AND MOBILE APPARATUS

BACKGROUND OF THE INVENTION

Field of the Invention

The present invention relates to a light emitting apparatus, an imaging apparatus, an electronic apparatus, an illumination apparatus, and a mobile apparatus, and, for example, to a light emitting apparatus including an organic light-emitting element.

Description of the Related Art

An organic light-emitting element (called an organic electroluminescence element or organic light-emitting element) is an electronic element including a pair of electrodes and an organic compound layer arranged between the electrodes. Excitons of a luminous organic compound in the organic compound layer are generated by injecting electrons and holes from the pair of electrodes, and when the excitons return to a ground state, the organic light-emitting element emits light. As the characteristics of the organic light-emitting element, for example, a low-driving voltage, various light emission wavelengths, high-speed responsiveness, and thinning/weight reduction of a light emitting device are possible.

Japanese Patent Laid-Open No. 2009-223036 (to be referred to as PTL 1 hereinafter) discloses an arrangement in which when applying the same gate-source voltage to a driving transistor in a pixel of each light emitting color to implement appropriate white balance, a flowing current amount changes. More specifically, PTL 1 describes that the mobility of the driving transistor, the thickness of an insulating film, and the dielectric constant of the insulating film are different for each color.

Similar to PTL 1, if the structure of the driving transistor is changed for each color, it is necessary to use a plurality of different materials and increase the number of manufacturing steps, and thus the steps are complicated, resulting in an increase in manufacturing cost.

SUMMARY OF THE INVENTION

The present invention has been made in consideration of the above problem, and provides a light emitting apparatus that readily implements appropriate white balance.

According to an embodiment, there is provided a light emitting apparatus comprising a plurality of pixels with different light emitting colors, wherein each of the plurality of pixels includes a light-emitting element configured to emit light with one of at least three different light emitting colors, a driving transistor configured to supply a current to the light-emitting element in accordance with a voltage supplied to a gate, a write transistor configured to supply a signal voltage from a signal line to the gate of the driving transistor, and a capacitance at a connection portion between the driving transistor and the write transistor, and the capacitance is different for each light emitting color, and is larger in a pixel of a light emitting color in which a peak current flowing through the light-emitting element is larger.

Further features of the present invention will become apparent from the following description of exemplary embodiments (with reference to the attached drawings).

BRIEF DESCRIPTION OF THE DRAWINGS

FIG. 30 is a circuit diagram of examples of pixels of three light emitting colors of the light emitting apparatus according to the fourth embodiment;

DESCRIPTION OF THE EMBODIMENTS

Figure 1:
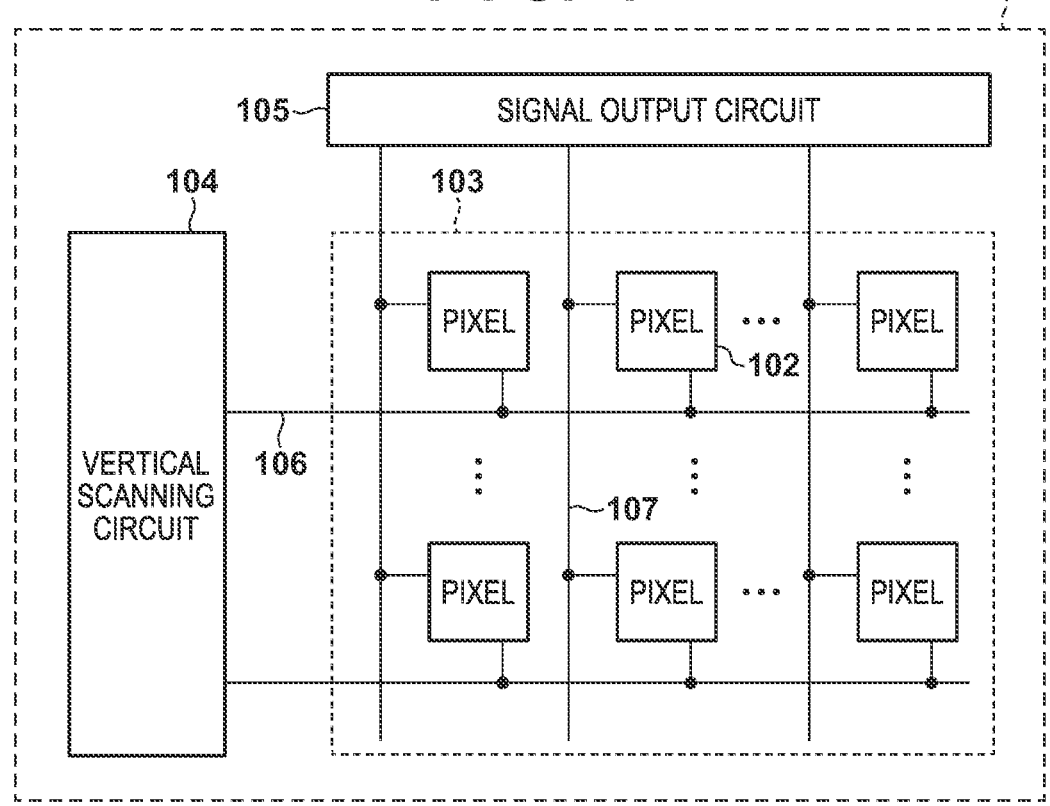
FIG. 1 is a view of an example of part of a light emitting apparatus according to the first embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

A case in which a driving transistor is connected to the anode of an organic light-emitting element and all transistors are p-type transistors will be described below. However, a light emitting apparatus according to the present invention is not limited to this. The polarity and conductivity types may all be reversed. Alternatively, the driving transistor may be a p-type transistor and the remaining transistors may be n-type transistors. Supplied potentials and connection are changed appropriately in accordance with the polarity and conductive type.

FIG. 1 is a view schematically showing an example of part of a light emitting apparatus according to this embodiment. As shown in FIG. 1, an organic light emitting apparatus 101 as an example of a light emitting apparatus including an organic light-emitting element includes a pixel array portion 103 and a driving unit arranged in the periphery of the pixel array portion 103. The pixel array portion 103 includes a plurality of pixels 102 two-dimensionally arranged in a matrix, and each pixel 102 includes an organic light-emitting element 201 (shown in FIG. 2). Each organic light-emitting element 201 includes an organic layer with a light emitting layer between the anode and the cathode. The organic layer may appropriately include one or more of a hole injection layer, a hole transport layer, an electron injection layer, and an electron transport layer in addition to the light emitting layer.

The organic light emitting apparatus 101 includes the driving unit that drives each pixel 102. For example, the driving unit includes a vertical scanning circuit 104 and a signal output circuit 105. In the pixel array portion 103, a first scanning line 106 is arranged for each pixel row in a row direction. In addition, a signal line 107 is arranged for each pixel column in a column direction.

Each first scanning line 106 is connected to the output terminal of a corresponding row of the vertical scanning circuit 104. Each signal line 107 is connected to the output terminal of the signal output circuit 105. The vertical scanning circuit 104 supplies a write control signal to the first scanning line 106 at the time of writing a video signal in each pixel 102 of the pixel array portion 103. The signal output circuit 105 outputs a luminance signal with a voltage (to be referred to as a signal voltage Vsig hereinafter) corresponding to luminance information.

Figure 2:
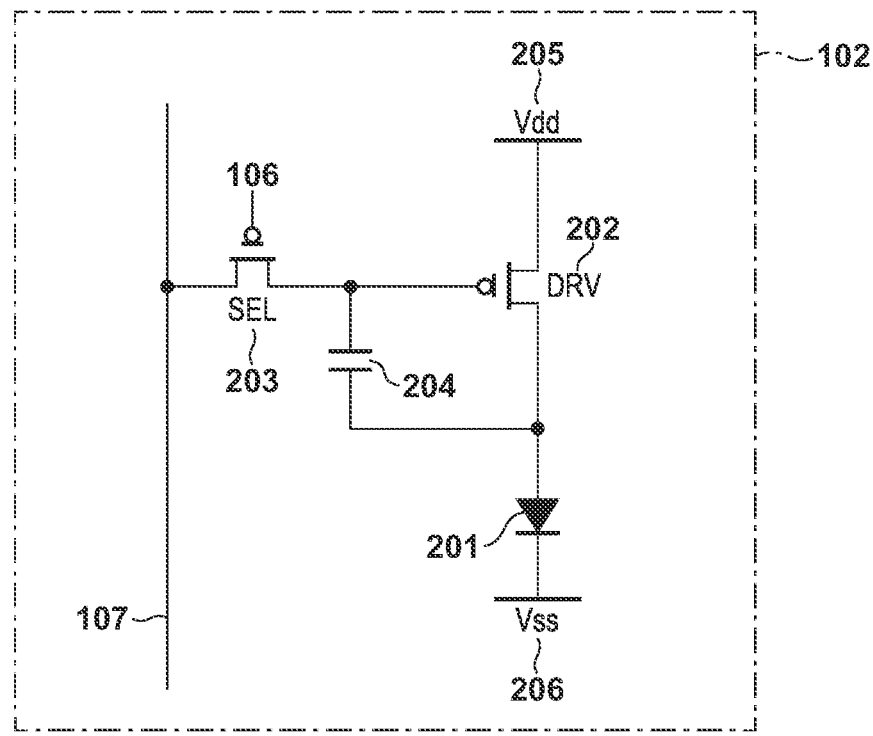
FIG. 2 is a circuit diagram of an example of a pixel of the light emitting apparatus according to the first embodiment.

FIG. 2 is a circuit diagram of an example of the pixel 102 of the organic light emitting apparatus 101 shown in FIG. 1. As shown in FIG. 2, the pixel 102 includes the organic light-emitting element 201, a driving transistor 202, a write transistor 203, and a first capacitive element 204.

The total number of transistors, the total number of capacitive elements, and a combination of the conductivity types of the transistors are merely examples, and the present invention is not limited to this arrangement. When a transistor is connected between elements A and B, one of the source and drain of the transistor is connected to one of elements A and B and the other of the source and drain of the transistor is connected to the other of elements A and B. Therefore, when the transistor is connected between elements A and B, a case is excluded, in which the gate of the transistor is connected to one of elements A and B, one of the source and drain of the transistor is connected to the other of elements A and B, and the other of the source and drain is not connected to one of elements A and B.

As a practical arrangement, one (the drain in this example) of the source and drain of the driving transistor 202 is connected to the first electrode (the anode in this example) of the organic light-emitting element 201. The other (the source in this example) of the source and drain of the driving transistor 202 is connected to a first power supply terminal 205 (to be referred to as a Vdd 205 hereinafter) applied with a power supply potential (to be referred to as a Vdd hereinafter). The second electrode (the cathode in this example) of the organic light-emitting element 201 is connected to a second power supply terminal 206 (to be referred to as a Vss 206 hereinafter) applied with a reference potential (to be referred to as a Vss hereinafter).

One of the source and drain of the write transistor 203 is connected to the gate of the driving transistor 202, and the other of the source and drain of the write transistor 203 is connected to the signal line 107. The gate of the write transistor 203 is connected to the first scanning line 106.

The first capacitive element 204 is connected between the gate of the driving transistor 202 and one (the drain in this example) of the source and drain of the driving transistor 202. The first capacitive element 204 may include a parasitic capacitance and a MIM (Metal-Insulator-Metal) structure.

The driving transistor 202 supplies a current from the Vdd 205 to the organic light-emitting element 201, thereby causing the organic light-emitting element 201 to emit light. More specifically, the driving transistor 202 supplies a current corresponding to the signal voltage of the signal line 107 to the organic light-emitting element 201. This current-drives the organic light-emitting element 201 to emit light.

The write transistor 203 is rendered conductive in response to the write control signal applied to the gate from the vertical scanning circuit 104 via the first scanning line 106. Thus, the write transistor 203 writes, in the pixel 102, the signal voltage of the video signal corresponding to the luminance information supplied from the signal output circuit 105 via the signal line 107. The written signal voltage is applied to the gate of the driving transistor 202.

When an organic EL (Organic Electroluminescent) element as an example of the organic light-emitting element 201 emits light, the amount of a current flowing through the driving transistor 202 is changed in accordance with luminance. This charges the capacitance between the first electrode (the anode in this example) and the second electrode (the cathode in this example) of the organic light-emitting element 201 to a predetermined potential, thereby causing a current corresponding to the potential difference between the first electrode and the second electrode to flow. Thus, the organic light-emitting element 201 emits light with predetermined luminance.

Figure 3:
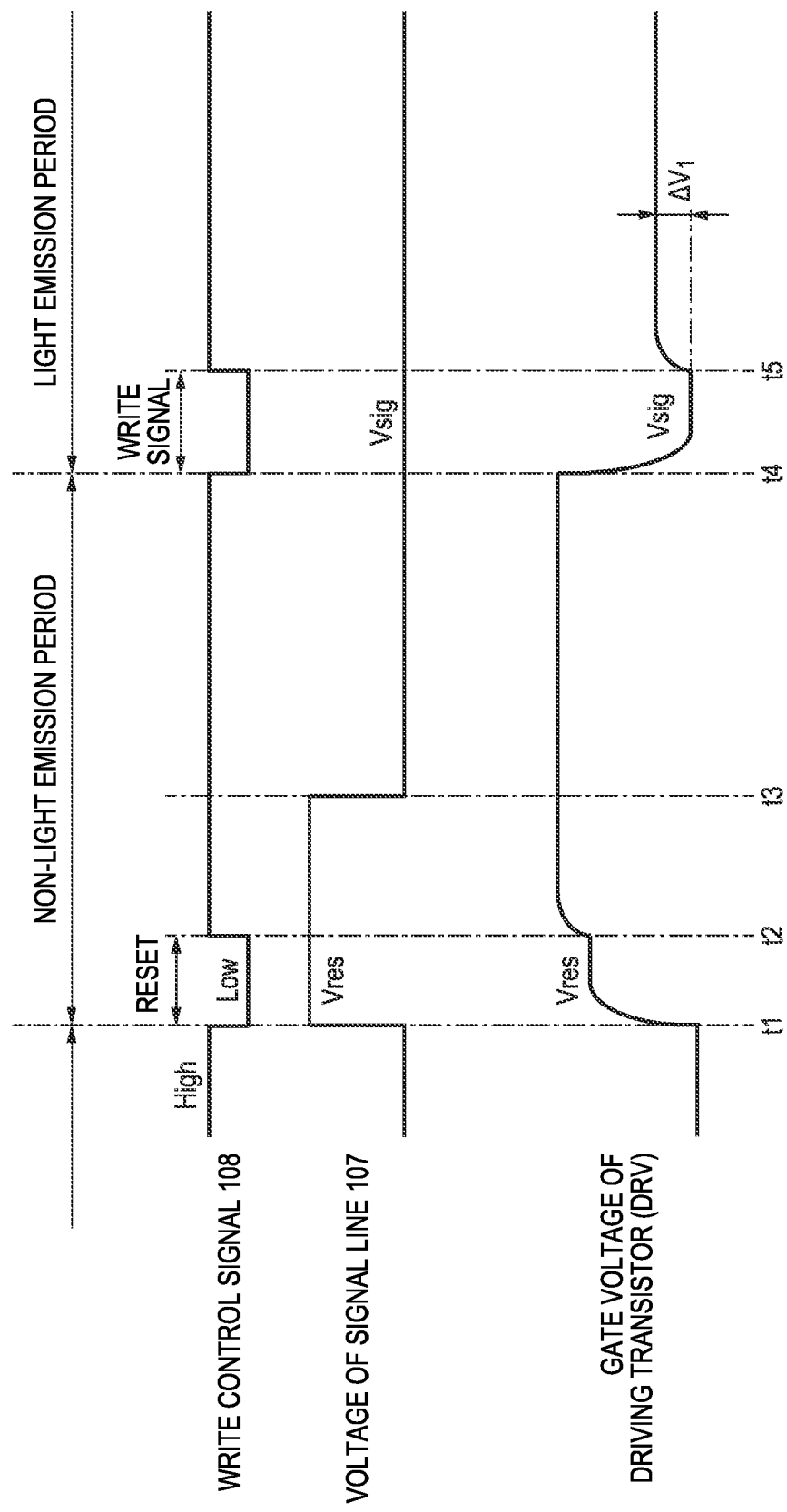
FIG. 3 is a timing chart of the light emitting apparatus according to the first embodiment.

An outline of the operation of the light emitting apparatus according to this embodiment will first be described with reference to a timing chart shown in FIG. 3. Referring to FIG. 3, a period before time t1 is the light emission period of the organic light-emitting element 201 in a preceding frame. During the light emission period, the write transistor 203 is in an OFF state. At time t1, a new frame starts. At time t1, when the write control signal 108 from the first scanning line 106 transitions from High to Low, the write transistor 203 is set in an ON state. This writes a reset voltage (to be referred to as a Vres hereinafter) of the signal line 107 in the gate of the driving transistor 202, and the driving transistor 202 is set in the OFF state. Thus, no current is supplied from the driving transistor 202 to the organic light-emitting element 201, thereby setting a non-light emission state. As described above, a period (a period from time t1 to time t2) during which the gate potential of the driving transistor 202 is set to the Vres is a reset period.

At time t2, when the write control signal 108 transitions from Low to High, the write transistor 203 is set in the OFF state, and the gate potential of the driving transistor 202 is set in a floating state.

At time t3, the signal voltage of the signal line 107 transitions from the Vres to the Vsig. At time t4, when the write control signal 108 transitions from High to Low, the write transistor 203 is set in the ON state. This supplies the signal voltage Vsig of the signal line 107 to the gate of the driving transistor 202, and thus a predetermined current flows through the driving transistor 202. As described above, a period (a period from time t4 to time t5) during which the gate potential of the driving transistor 202 is set to the Vsig is a signal write period.

At time t5, when the write control signal 108 transitions from Low to High, the write transistor 203 is set in the OFF state. At this time, with capacitive coupling between the gate of the write transistor 203 and that of the driving transistor 202, the gate potential of the driving transistor 202 increases by $\Delta V_1$. $\Delta V_1$ is given by:

$$\Delta V_1 = Vhl * Cp/(Cg+Cp) \tag{1}$$

where Vhl represents a potential between High voltage and Low voltage of the write control signal, Cp represents the parasitic capacitance between the gate of the write transistor 203 and that of the driving transistor 202, and Cg represents the gate capacitance of the driving transistor 202 except for Cp, in the other words, Cg is the capacitance at the connection portion between the driving transistor 202 and the write transistor 203.

The gate potential of the driving transistor 202 is given by $Vsig+\Delta V_1$, and a gate-source voltage Vgs held by the driving transistor 202 during the light emission period is given by:

$$Vgs = Vg - Vs = Vsig + \Delta V_1 - Vdd \tag{2}$$

Figure 4:
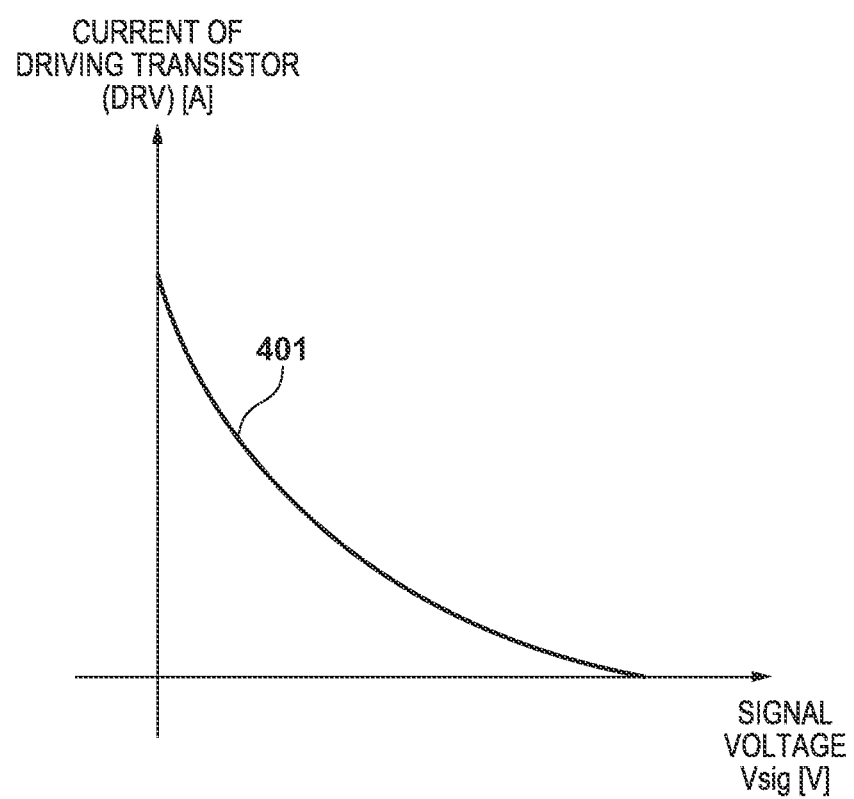
FIG. 4 is a graph showing the electrical characteristic of the pixel of the light emitting apparatus according to the first embodiment.

FIG. 4 shows an example of a characteristic 401 of a current flowing through the driving transistor 202 with respect to the Vsig in the pixel 102. According to equation (2), as the Vsig is lower, the Vg is lower, and the current is larger. As the current flowing through the driving transistor 202 is larger, the light emission amount of the organic light-emitting element 201 increases. This embodiment assumes that the driving transistor 202 is used in a sub-threshold region and a saturation region.

Figure 5:
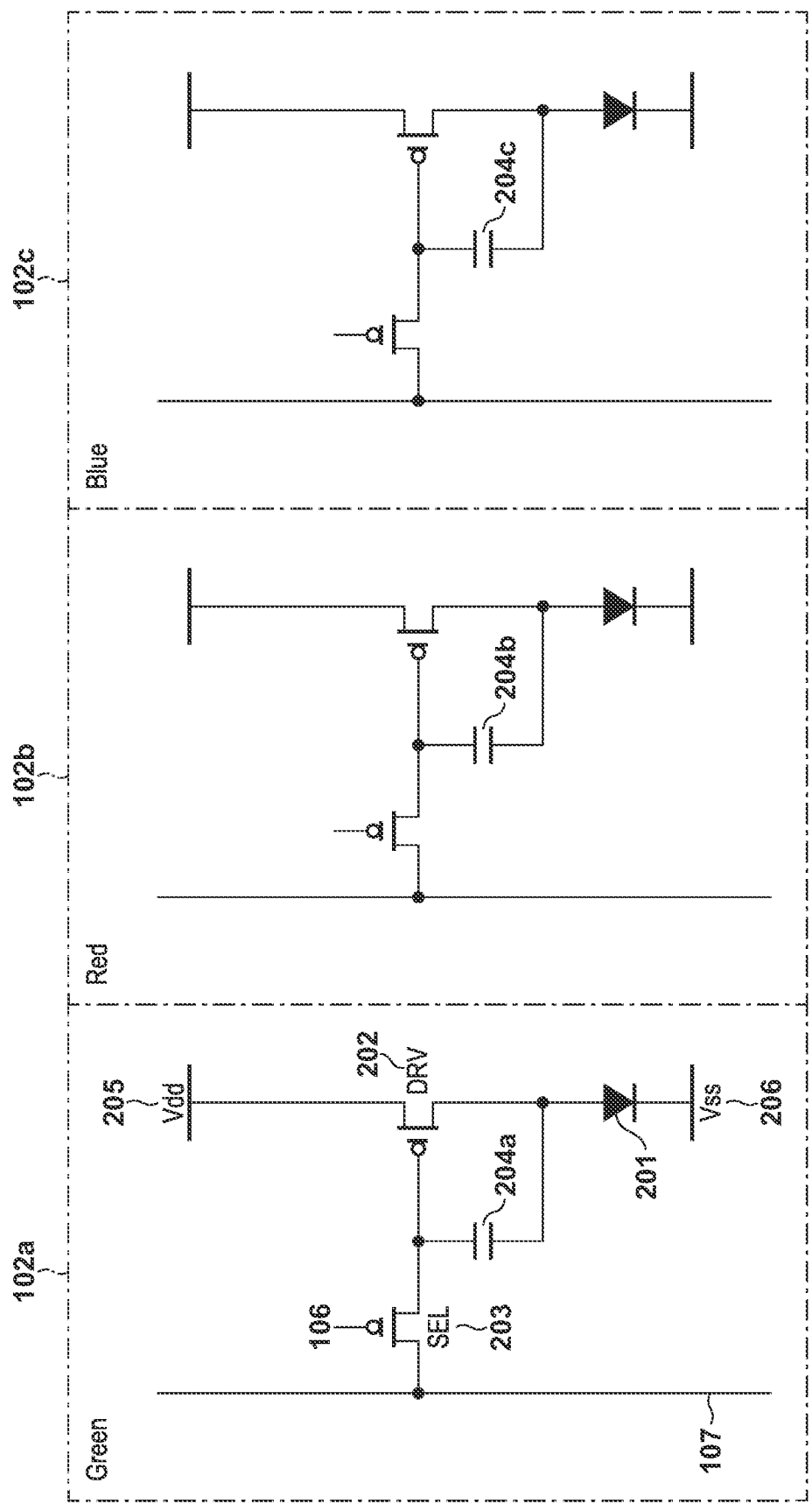
FIG. 5 is a circuit diagram of examples of pixels of three light emitting colors of the light emitting apparatus according to the first embodiment.

FIG. 5 is a circuit diagram corresponding to pixels of at least three different light emitting colors. The three light emitting colors are, for example, green, red, and blue. Each pixel can emit light with one of at least three light emitting colors. A pixel 102a is a pixel that emits green light, and includes a capacitive element 204a. A pixel 102b is a pixel that emits red light, and includes a capacitive element 204b. A pixel 102c is a pixel that emits blue light, and includes a capacitive element 204c. This embodiment assumes that the magnitude relationship of these capacitances is represented by 204a>204b>204c, and the gate capacitances Cg of the driving transistors have a relationship of "pixel 102a>pixel 102b>pixel 102c".

The capacitance 204a can have a capacitance value different from that of the capacitance 204b so that if the pixel 102a and 102b receive the same luminance signal, the current flowing through the light-emitting element of pixel 102a becomes larger than that flowing through the light-emitting element of pixel 102b. Note that if the carrier transport types of the transistors are different from each other, the magnitude relationship of the capacitance values of the capacitances is reversed.

Figure 6:
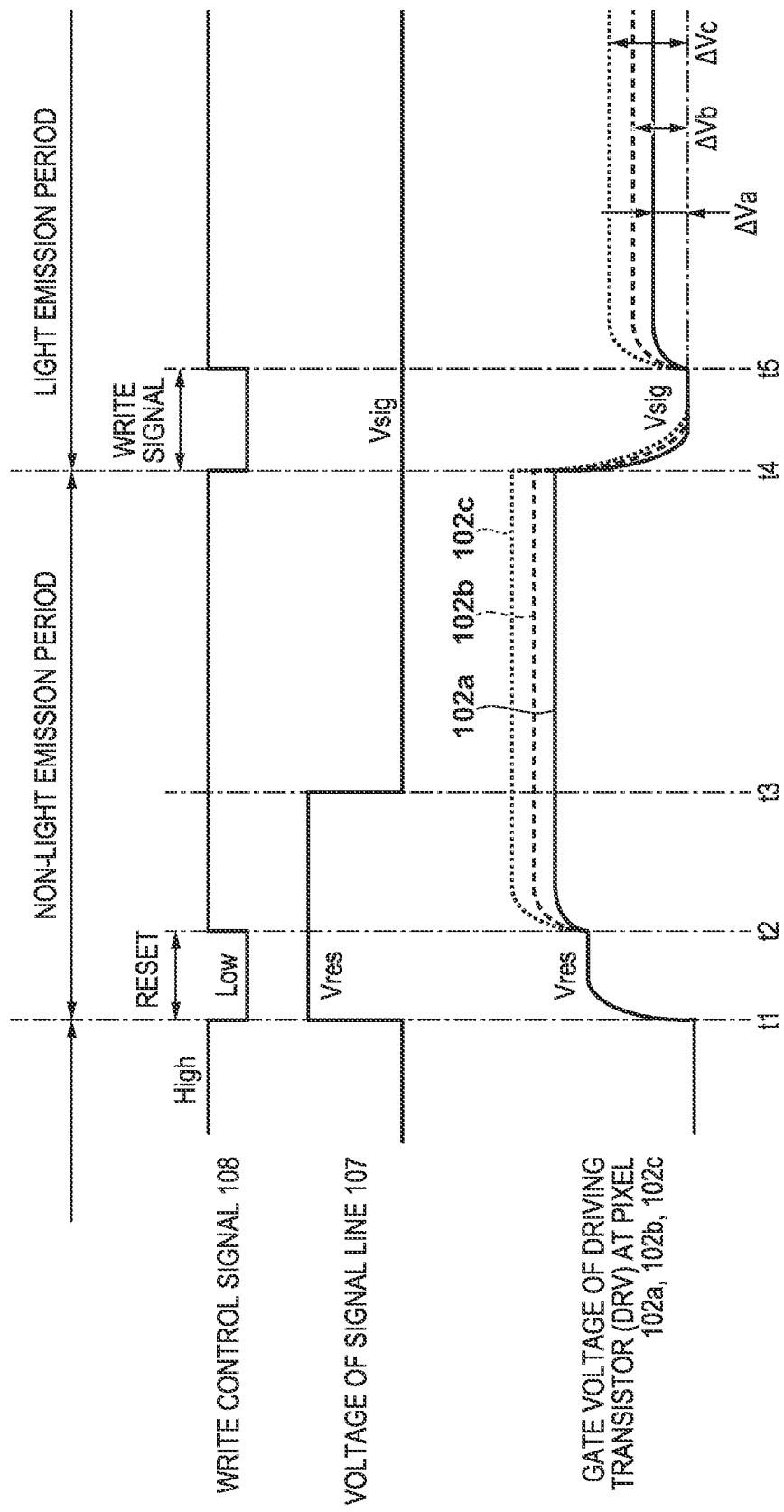
FIG. 6 is a timing chart of the pixels of the three light emitting colors of the light emitting apparatus according to the first embodiment.

An outline of an operation by the different gate capacitances Cg for the respective light emitting colors will be described next with reference to FIG. 6. Referring to FIG. 6, at times t2 and t5, the gate potentials of the driving transistors 202 increase in the pixels 102a, 102b, and 102c by $\Delta Va$, $\Delta Vb$, and $\Delta Vc$, respectively. According to equation (1), as the gate capacitance Cg of the driving transistor 202 is larger, $\Delta V$ is smaller, and thus $\Delta Va < \Delta Vb < \Delta Vc$ holds. Therefore, the voltages Vg of the driving transistors 202 have a relationship of "pixel 102a<pixel 102b<pixel 102c". As the Vg is lower, the current amount of the driving transistor 202 is larger. Thus, the current amounts of the driving transistors 202 in the pixels have a relationship of "pixel 102a>pixel 102b>pixel 102c". However, during a period from time t1 to time t4, the driving transistor 202 is in the OFF state, and thus the organic light-emitting element 201 is set in a non-light emission state regardless of the Vg.

Figure 7:
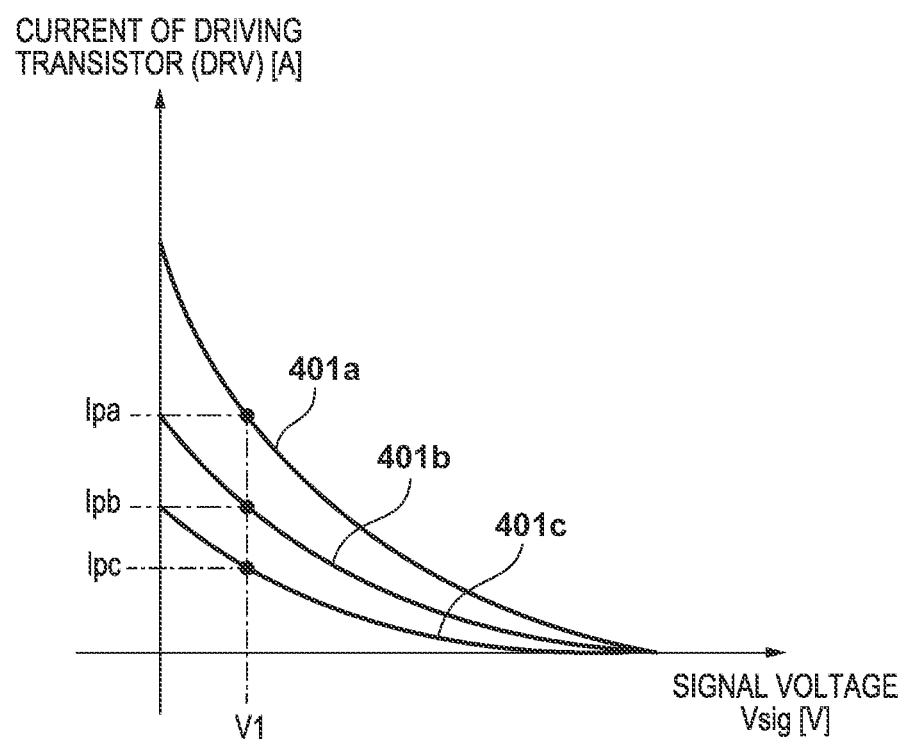
FIG. 7 is a graph showing the electrical characteristics of the pixels of the three light emitting colors of the light emitting apparatus according to the first embodiment.

FIG. 7 shows examples of the peak current characteristics 401 (401a, 401b, and 401c) of the light-emitting elements for the respective light emitting colors (green, red, and blue) for the same signal voltage with respect to the Vsig when white balance is satisfactory. At a predetermined voltage V1, a peak current Ipa of the green light-emitting element, a peak current Ipb of the red light-emitting element, and a peak current Ipc of the blue light-emitting element are obtained, and Ipa>Ipb>Ipc holds. To adjust the peak current characteristics, the capacitance values of the capacitive elements 204a, 204b, and 204c are adjusted appropriately. This can control the peak luminance in each of the pixels 102a (green), 102b (red), and 102c (blue). For example, when increasing the luminance of the light emitting element that emits green light, the capacitance of the capacitive element 204a is increased to increase the peak current. By increasing the capacitance value of the capacitive element to increase the peak current, the white balance can be adjusted. As the capacitance is larger, the peak current is larger. The peak current is a largest current amount flowing through the driving transistor 202 in the pixel of each light emitting color. The peak luminance is highest luminance with which the organic light-emitting element 201 emits light when the peak current flows through the driving transistor 202. As described above, differences in luminance caused by differences in light emission efficiency among the light emitting colors of the organic light-emitting elements can also be adjusted.

As described above, it is possible to perform compensation so that the conversion ratio between the signal voltage Vsig and the gate-source voltage held by the driving transistor 202 is changed for each color by the gate capacitance Cg. This can readily implement appropriate white balance without changing the structure of the driving transistor for each color. A method of changing the gate capacitance Cg will be described in detail next.

Figure 8:
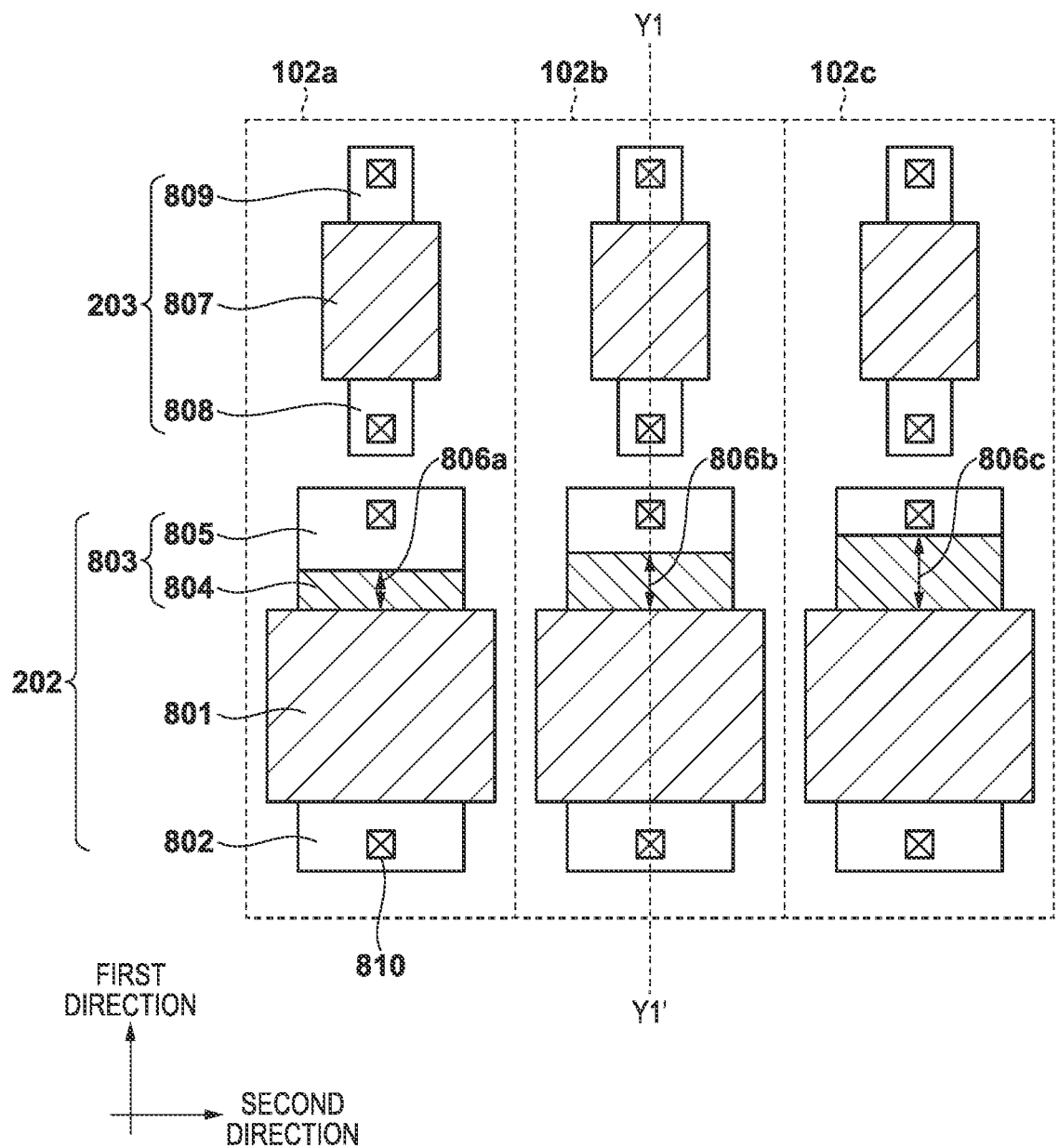
FIG. 8 is a plan view of Arrangement Example 1 of the pixels of the light emitting apparatus according to the first embodiment.

Arrangement Example 1 of the organic light-emitting element having the LDD structure will first be described. FIG. 8 is a plan view showing examples of a semiconductor layer and the transistors of the circuit shown in FIG. 5. As shown in FIG. 8, each write transistor 203 has a gate electrode 807, a source portion 808, and a drain portion 809. Each driving transistor 202 has a gate electrode 801, a source portion 802, and a drain portion 803, and the drain portion 803 is connected to the first electrode of the organic light-emitting element 201 (not shown). Furthermore, the drain portion 803 includes a lower-density p-type diffusion layer 804 and a p-type diffusion layer 805, and the lower-density p-type diffusion layer 804 is arranged between the gate electrode 801 and the p-type diffusion layer 805. The distance of a portion with a lower impurity density along a channel from the gate electrode 801 to the p-type diffusion layer 805 in the lower-density p-type diffusion layer 804 is an LDD (Lightly Doped Drain) length. In other words, the length can be said as the distance of a portion with a lower impurity density along a direction in which the current flows.

The LDD lengths of the driving transistors 202 in the pixels 102a, 102b, and 102c are indicated by 806a, 806b, and 806c, respectively, and have a length relationship of "806a<806b<806c". When, in the pixels 102a, 102b, and 102c, the parasitic capacitances between the gate electrodes 801 and the drain portions 803 are indicated by 204a, 204b, and 204c, the magnitude relationship of the capacitances is represented by 204a>204b>204c. Reference numeral 810 denotes a contact portion. In Arrangement Example 1, the source portions are denoted by 802 and 808 and the drain portions are denoted by 803 and 809. This relationship may be reversed.

Figure 9:
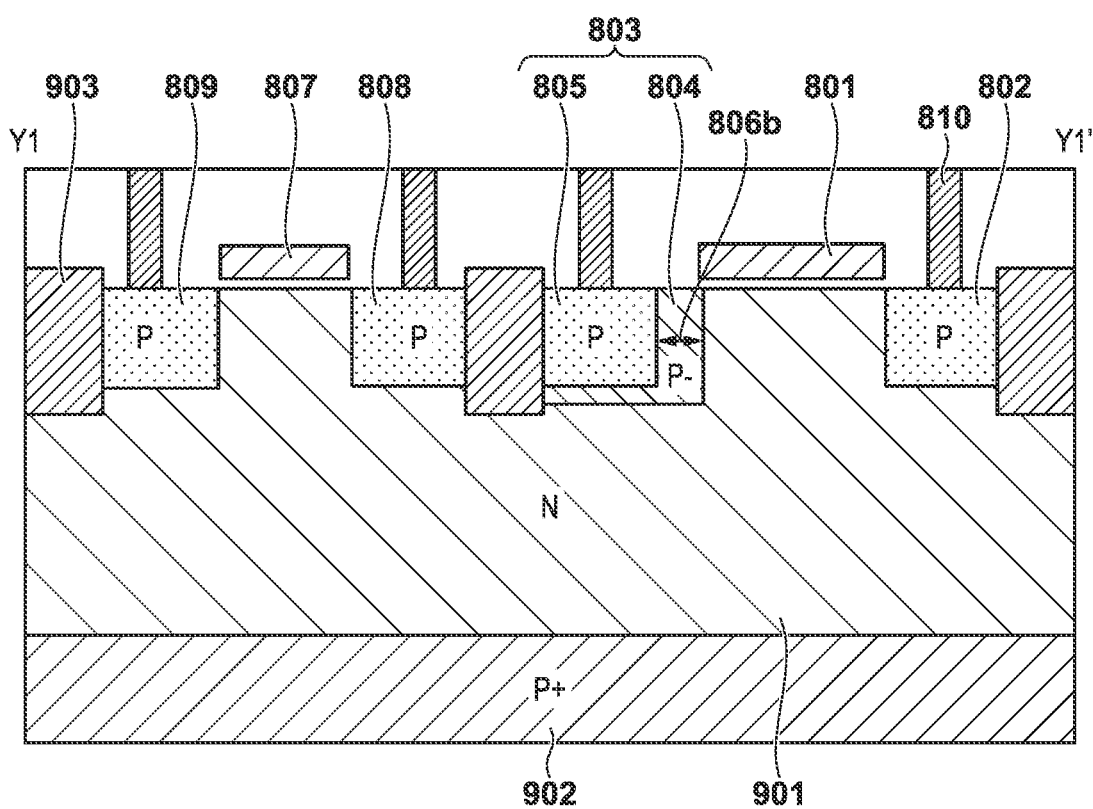
FIG. 9 is a sectional view of Arrangement Example 1 of the pixels of the light emitting apparatus according to the first embodiment.

FIG. 9 is a sectional view taken along a line Y1-Y1' in the plan view shown in FIG. 8. As shown in FIG. 9, the lower-density p-type diffusion layer 804 is arranged between the p-type diffusion layer 805 and an n-type well layer 901. Reference numeral 902 denotes a p-type substrate; and 903, an insulator isolation portion which may use STI (Shallow Trench Isolation), LOCOS (Local Oxidation Of Silicon), or n-type diffusion layer isolation.

In this example, it is possible to change the gate capacitance Cg by only changing, for each light emitting color, the length of a mask when generating the LDD structure.

Another Arrangement Example 2 will be described next with reference to FIG. 10. In this example, the diffusion layer density of the drain portion of the driving transistor is different for each light emitting color. Components different from Arrangement Example 1 will mainly be described below.

Figure 10:
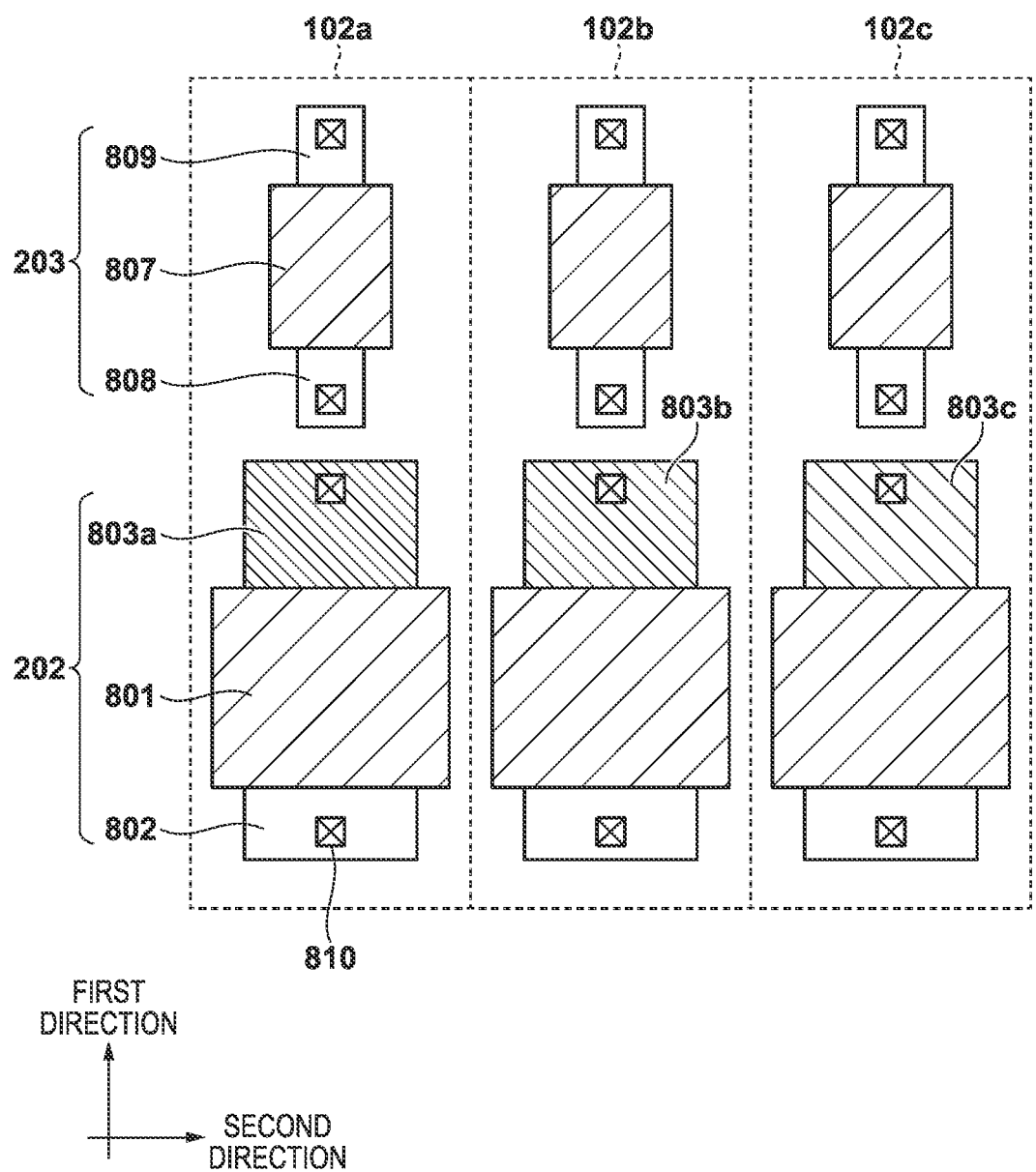
FIG. 10 is a plan view of Arrangement Example 2 of the pixels of the light emitting apparatus according to the first embodiment.

FIG. 10 is a plan view showing examples of a semiconductor layer and the transistors of the circuit shown in FIG. 5. As shown in FIG. 10, p-type diffusion layers as the drain portions of the driving transistors 202 in the pixels 102a, 102b, and 102c are denoted by 803a, 803b, and 803c, respectively. The relationship among the impurity densities of the p-type diffusion layers is represented by 803a>803b>803c. When, in the pixels 102a, 102b, and 102c, the parasitic capacitances between the gate electrodes 801 and the drain portions are indicated by 204a, 204b, and 204c, the magnitude relationship of the capacitances is represented by 204a>204b>204c. With this arrangement, it is possible to obtain the same effect as in Arrangement Example 1. In this example, the source portions are denoted by 802 and the drain portions are denoted by 803a, 803b, and 803c. This relationship may be reversed.

Arrangement Example 3 will be described with reference to FIG. 11. In this example, in a planer view, an area where a wiring connected to the drain portion of the driving transistor overlaps the gate electrode is different for each light emitting color. Components different from other arrangement examples will mainly be described below.

Figure 11:
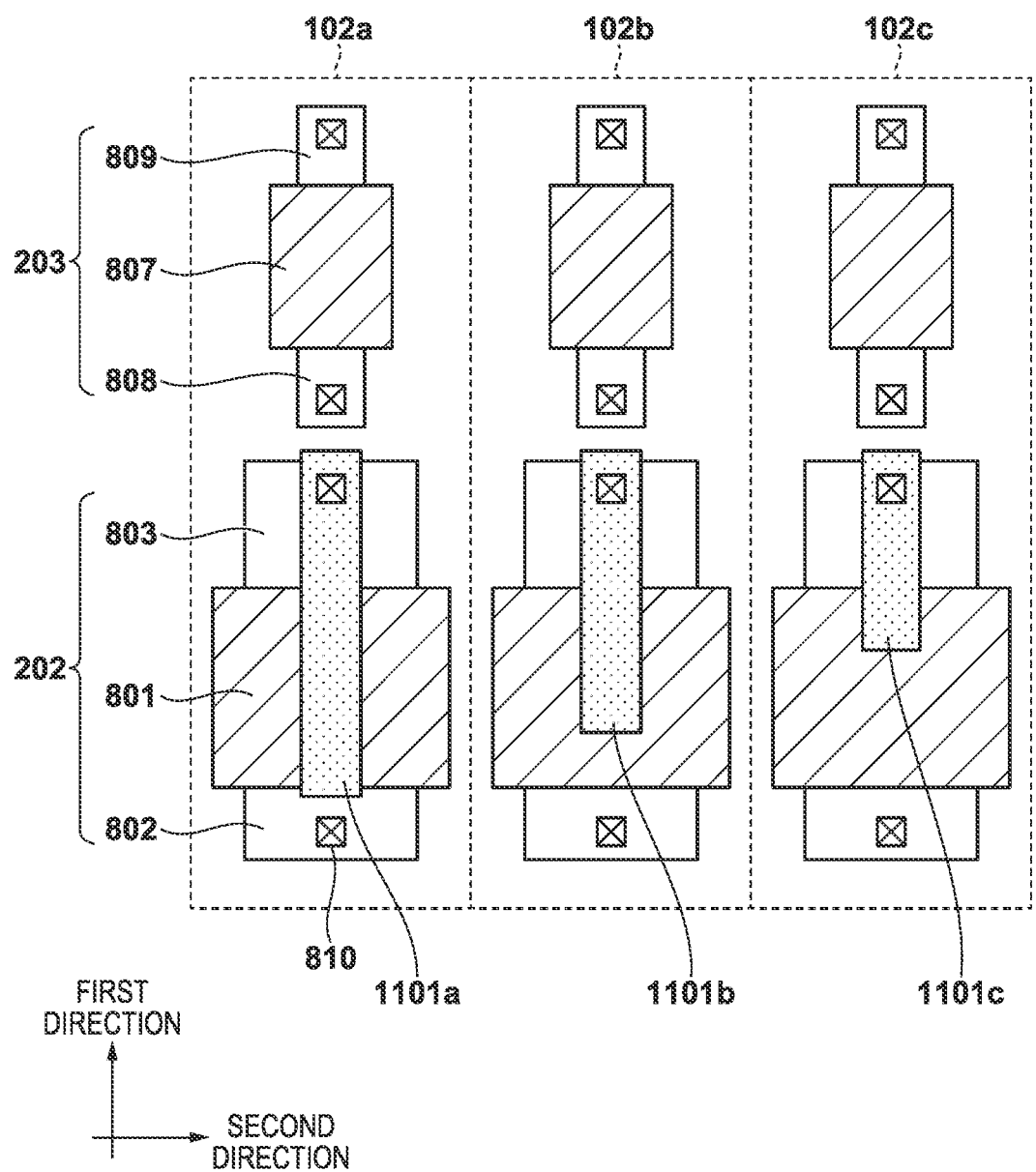
FIG. 11 is a plan view of Arrangement Example 3 of the pixels of the light emitting apparatus according to the first embodiment.

FIG. 11 is a plan view showing examples of a semiconductor layer and the transistors of the circuit shown in FIG. 5. As shown in FIG. 11, wirings connected to the drain portions 803 of the driving transistors 202 in the pixels 102a, 102b, and 102c are denoted by 1101a, 1101b, and 1101c, respectively. In a planar view, areas where the wirings overlap the gate electrodes of the driving transistors 202 have a relationship of "pixel 102a>pixel 102b>pixel 102c". When, in the pixels 102a, 102b, and 102c, the parasitic capacitances between the gate electrodes 801 and the drain portions 803 are indicated by 204a, 204b, and 204c, the magnitude relationship of the capacitances is represented by 204a>204b>204c. Thus, the capacitances are adjusted to obtain the white balance in accordance with the light emitting colors. With this arrangement, it is possible to obtain the same effect as in other examples. In this embodiment, the source portions are denoted by 802 and the drain portions are denoted by 803. This relationship may be reversed. As described above, in this example, it is possible to change the gate capacitance Cg by only changing the wiring length.

Arrangement Example 4 will be described next with reference to FIGS. 12 and 13. In this example, the first capacitive element of the pixel has a MIM structure, and the capacitance is different for each light emitting color. Components different from other arrangement examples will mainly be described below.

Figure 12:
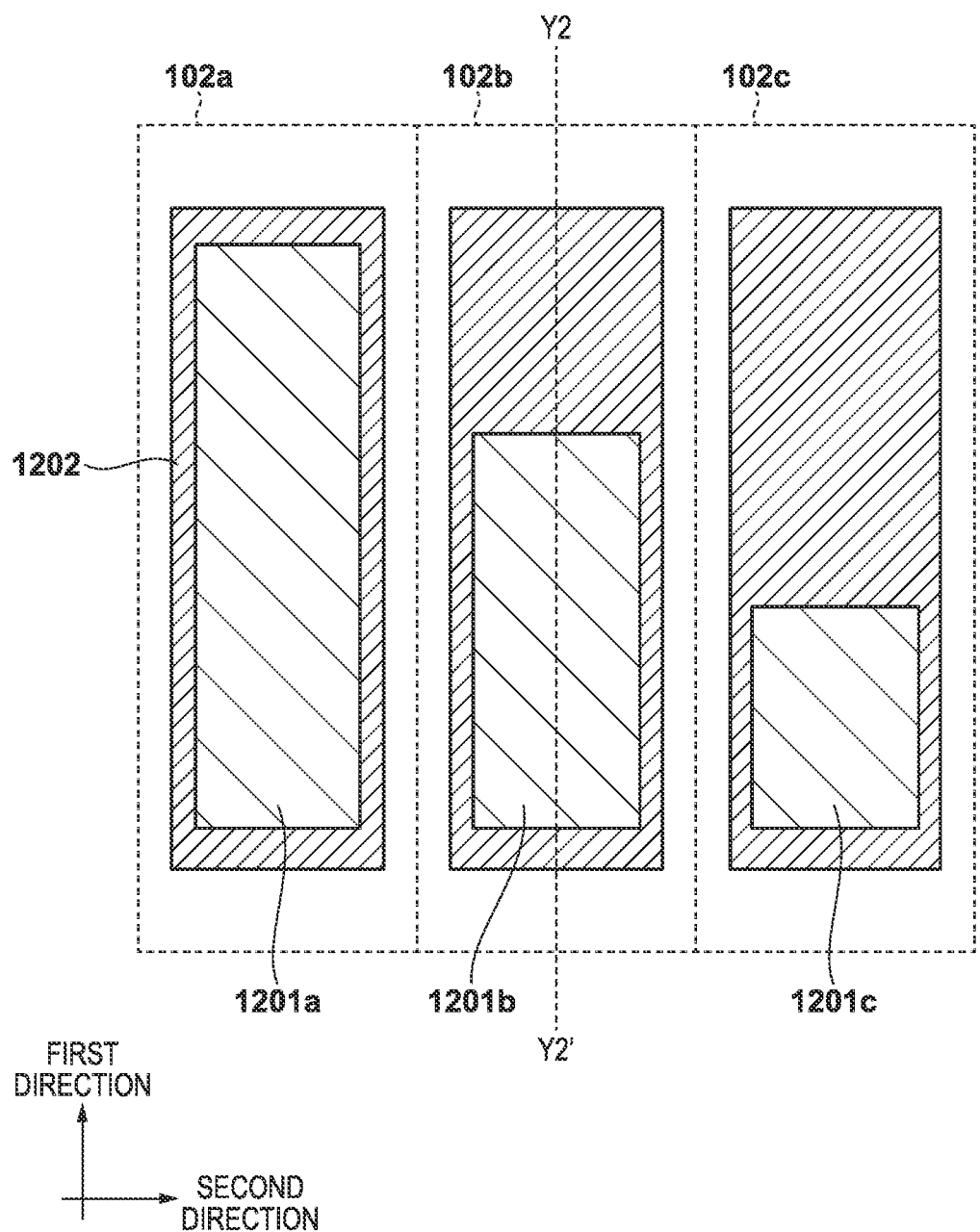
FIG. 12 is a plan view of Arrangement Example 4 of the pixels of the light emitting apparatus according to the first embodiment.

FIG. 12 is a plan view of the capacitive elements 204a, 204b, and 204c shown in FIG. 5. The capacitive element 204a has a MIM structure including an oxide film between an upper electrode 1201a and a lower electrode 1202, the capacitive element 204b has a MIM structure including an oxide film between an upper electrode 1201b and the lower electrode 1202, and the capacitive element 204c has a MIM structure including an oxide film between an upper electrode 1201c and the lower electrode 1202. Each upper electrode is connected to the first electrode of the organic light-emitting element 201, and the lower electrode 1202 is connected to the gate of each driving transistor 202. In the planar view, areas where the respective upper electrodes and the lower electrode 1202 overlap each other have a relationship of "pixel 102a>pixel 102b>pixel 102c". Therefore, the magnitude relationship of the capacitances is represented by 204a>204b>204c. To obtain white balance, the peak current is changed by the capacitance to change the luminance in accordance with the light emitting color. With this arrangement, it is possible to obtain the same effect as in other examples.

Figure 13:
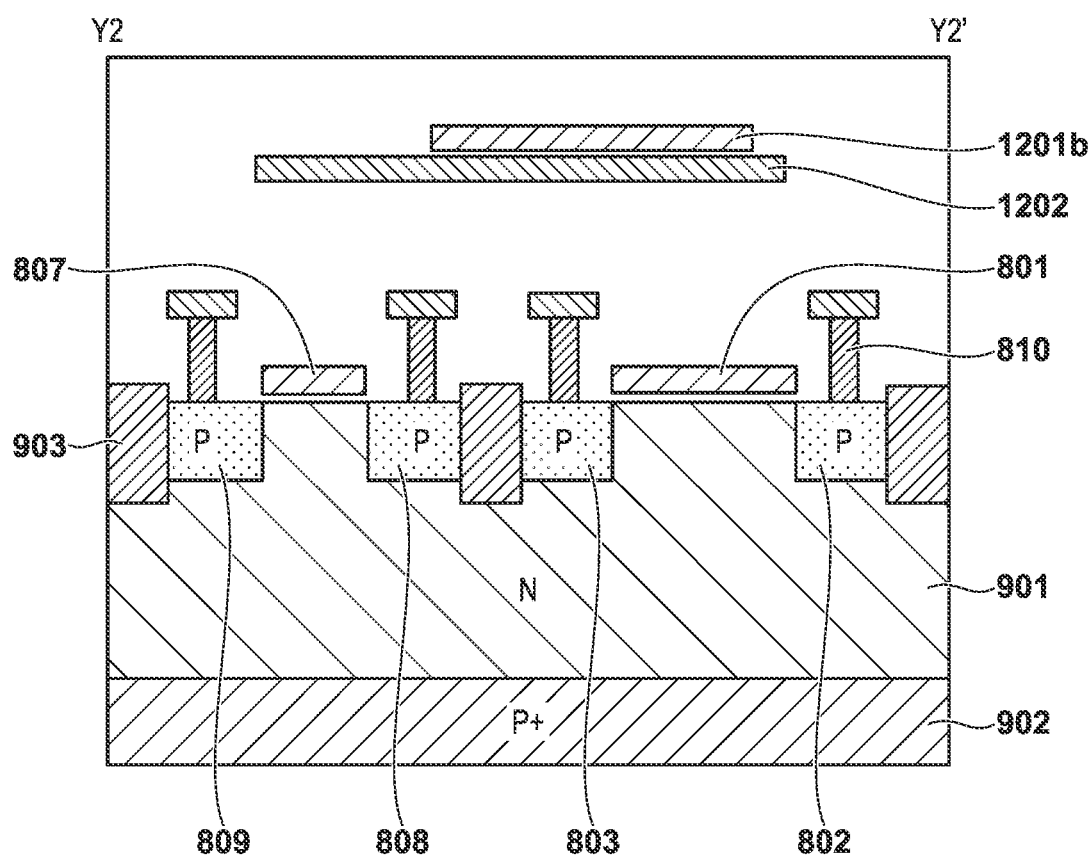
FIG. 13 is a sectional view of Arrangement Example 4 of the pixels of the light emitting apparatus according to the first embodiment.

FIG. 13 is a sectional view taken along a line Y2-Y2' in the planar view shown in FIG. 12. As shown in FIG. 13, the upper electrode 1201b is arranged above the lower electrode 1202. In this embodiment, the upper electrode is connected to the first electrode of the organic light-emitting element 201, and the lower electrode 1202 is connected to the gate of the driving transistor 202. However, the relationship may be reversed. When forming electrodes, it is possible to create the first capacitive elements of different capacitances for the respective light emitting colors at once.

Second Embodiment

The second embodiment will be described next with reference to FIGS. 14 to 18. This embodiment provides an arrangement including a light emission control transistor 1501 that controls supply of a current from a Vdd 205 to a driving transistor 202. This embodiment will also describe compensation for a threshold voltage of the driving transistor 202. Components different from the first embodiment will mainly be described below.

Figure 14:
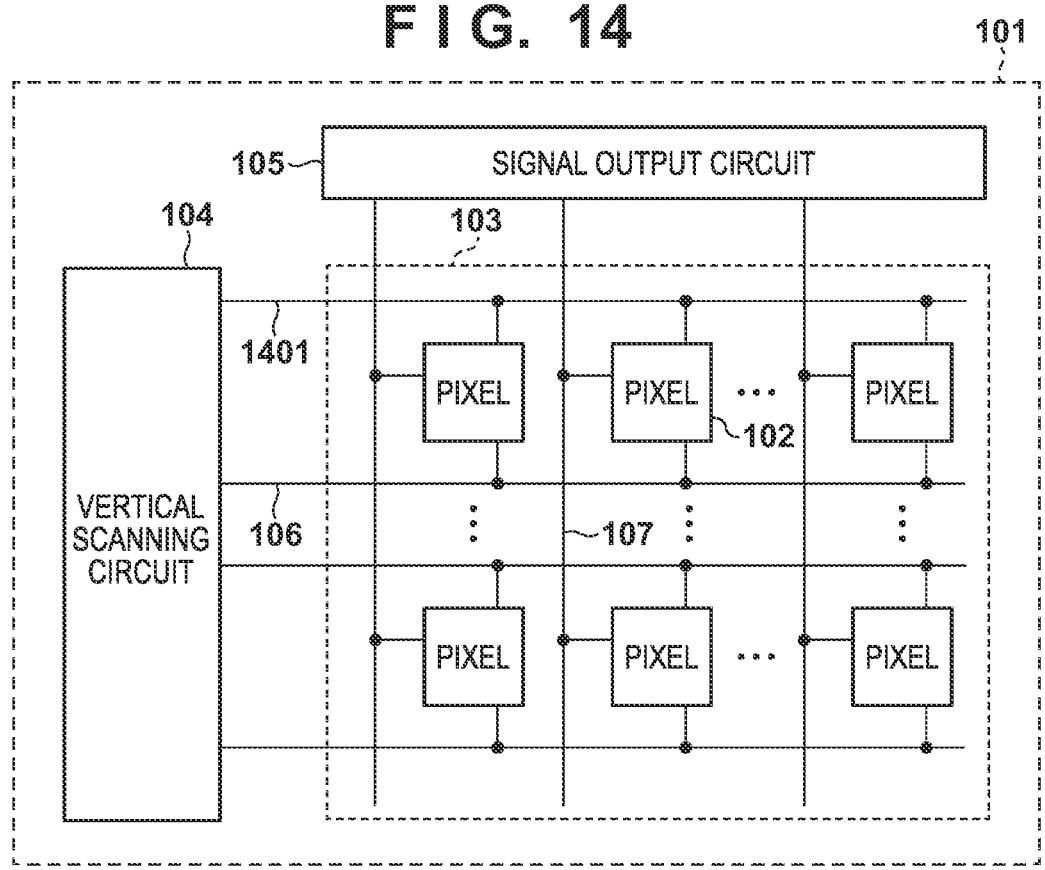
FIG. 14 is a view of an example of part of a light emitting apparatus according to the second embodiment.

FIG. 14 is a view schematically showing an example of part of a light emitting apparatus according to this embodiment. As shown in FIG. 14, in a pixel array portion 103, a second scanning line 1401 is arranged for each pixel row in a row direction. Each second scanning line 1401 is connected to the output terminal of a corresponding row of a vertical scanning circuit 104, and supplies a light emission control signal 1402 to each pixel 102.

Figure 15:
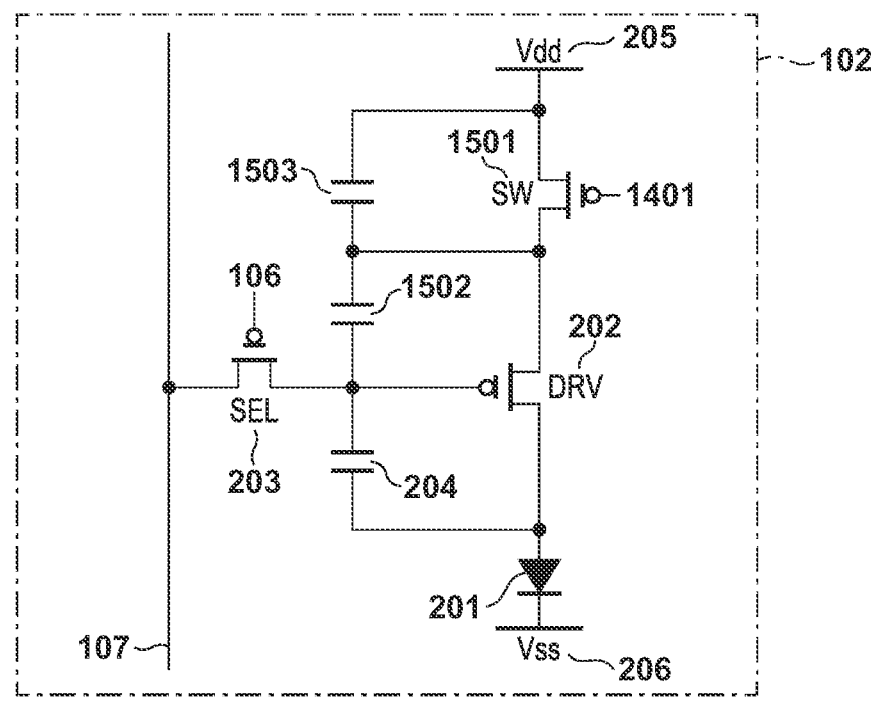
FIG. 15 is a circuit diagram of an example of a pixel of the light emitting apparatus according to the second embodiment.

FIG. 15 is a circuit diagram of an example of a pixel of the light emitting apparatus shown in FIG. 14. As shown in FIG. 15, one (the drain in FIG. 15) of the source and drain of the light emission control transistor 1501 is connected to one (the source in this example) of the source and drain of the driving transistor 202. The other of the source and drain of the light emission control transistor 1501 is connected to the Vdd 205. The gate of the light emission control transistor 1501 is connected to the second scanning line 1401. A second capacitive element 1502 is connected between the gate and source of the driving transistor 202. The second capacitive element 1502 is a capacitance for holding the threshold voltage of the driving transistor 202. A third capacitive element 1503 is connected between the source of the driving transistor 202 and the Vdd 205.

The light emission control transistor 1501 is rendered conductive in response to the light emission control signal 1402 applied to the gate from the vertical scanning circuit 104 via the second scanning line 1401, thereby permitting supply of the current from the Vdd 205 to the driving transistor 202. This allows the driving transistor 202 to cause an organic light-emitting element 201 to emit light. That is, the light emission control transistor 1501 has a function as a transistor that controls light emission/non-light emission of the organic light-emitting element 201. As described above, a switching operation of the light emission control transistor 1501 can control the ratio between the light emission period and the non-light emission period of the organic light-emitting element 201 (so-called duty control). This duty control can reduce afterimage blurring accompanying light emission from each pixel 102 over a period of one frame, and further improve the image quality of a moving image in particular.

Due to manufacturing variations, the threshold voltage of the driving transistor 202 may be different for each pixel. When the same Vsig is written in a plurality of pixels of the same light emitting color, a current amount flowing through the driving transistor 202 is different for each pixel, resulting in a variation in light emission amount. To solve this problem, before writing the Vsig, an operation (so-called threshold compensation operation) of holding the threshold voltage of the driving transistor 202 between the gate and source of the driving transistor 202 is performed. This threshold compensation operation can reduce the variation in current amounts of the driving transistor 202 among the pixels, thereby implementing uniform light emission.

In the threshold compensation operation, after causing a current to flow through the organic light-emitting element 201 via the light emission control transistor 1501 and the driving transistor 202, the light emission control transistor 1501 is set in the OFF state. This causes the current to flow through the organic light-emitting element 201 until the source-gate voltage of the driving transistor 202 is stabilized, that is, becomes an almost constant value, thereby implementing the threshold compensation operation.

Figure 16:
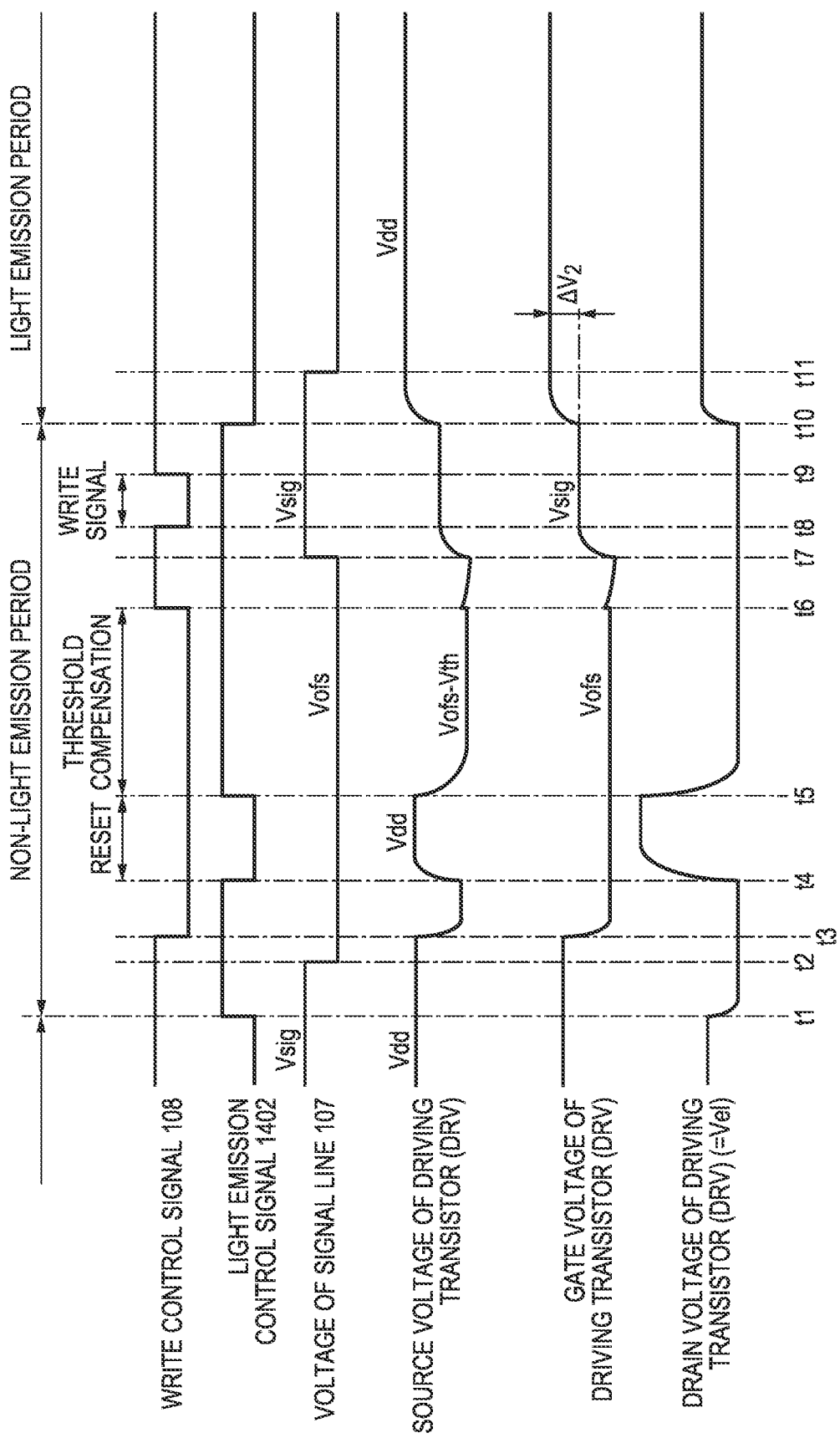
FIG. 16 is a timing chart of the light emitting apparatus according to the second embodiment.

The threshold compensation operation and the balance of each color will be described with reference to FIG. 16 that is a timing chart of the light emitting apparatus according to this embodiment. Referring to FIG. 16, a period before time t1 is the light emission period of the organic light-emitting element 201 in a preceding frame. During the light emission period, the light emission control transistor 1501 is in the ON state and a write transistor 203 is in the OFF state.

At time t1, a new frame starts. At time t1, when the light emission control signal 1402 transitions from Low to High, the light emission control transistor 1501 is set in the OFF state. Therefore, no current is supplied from the Vdd 205 to the organic light-emitting element 201 via the light emission control transistor 1501 and the driving transistor 202, and the organic light-emitting element 201 emits no light.

At time t2, the signal voltage of a signal line 107 is switched from a Vsig to a threshold compensation voltage (to be referred to as a Vofs hereinafter).

At time t3, when a write control signal 108 transitions from High to Low, the write transistor 203 is set in the ON state. This writes the Vofs of the signal line 107 in the gate of the driving transistor 202. Furthermore, since the source potential of the driving transistor 202 is in the floating state, this changes due to the influence of capacitive coupling between the gate and source of the driving transistor 202.

At time t4, when the light emission control signal 1402 transitions from High to Low, the light emission control transistor 1501 is set in the ON state. This makes the source of the driving transistor 202 have a voltage almost equal to the Vdd 205. A period during which the gate potential and source potential of the driving transistor 202 are initialized to the Vofs and the Vdd, respectively, is a reset period. During the reset period, a current is supplied from the Vdd 205 to the organic light-emitting element 201 via the light emission control transistor 1501 and the driving transistor 202. Therefore, the anode of the organic light-emitting element 201 is charged to increase the anode potential (to be referred to as a Vel hereinafter). At this time, the Vel is desirably a potential lower than the light emission threshold voltage of the organic light-emitting element 201. However, this embodiment is not limited to this since if the reset period is sufficiently short, the light emission amount is sufficiently small.

At time t5, when the light emission control signal 1402 transitions from Low to High, the light emission control transistor 1501 is set in the OFF state. This changes the source potential (to be referred to as a Vs hereinafter) of the driving transistor 202 to Vs=Vofs−Vth as a difference voltage between the Vofs and a threshold voltage (to be referred to as a Vth hereinafter) of the driving transistor 202. Since the gate potential (to be referred to as a Vg hereinafter) of the driving transistor 202 satisfies Vg=Vofs, the second capacitive element 1502 holds the Vth. This period (a period from time t5 to time t6) is a threshold compensation period. Therefore, during this period (the period from time t5 to time t6), the light emission control transistor 1501 and the second capacitive element 1502 function as a threshold compensation unit that compensates for a variation in the threshold voltage Vth of the driving transistor 202.

At time t6, when the write control signal 108 transitions from Low to High, the write transistor 203 is set in the OFF state. At time t7, the signal voltage of the signal line 107 is switched from the Vofs to the Vsig.

At time t8, when a write control signal 108 transitions from High to Low, the write transistor 203 is set in the ON state. This writes the Vsig of the signal line 107 in the gate of the driving transistor 202. Furthermore, since the source potential of the driving transistor 202 is in the floating state, this changes due to the influence of capacitive coupling between the gate and source of the driving transistor 202. A period during which the gate potential of the driving transistor 202 is set to the signal voltage Vsig is a signal write period.

At time t9, when the write control signal 108 transitions from Low to High, the write transistor 203 is set in the OFF state.

At time t10, when the light emission control signal 1402 transitions from High to Low, the light emission control transistor 1501 is set in the ON state. At this time, the source of the driving transistor 202 has a voltage almost equal to the Vdd 205. Then, a current is supplied from the Vdd 205 to the organic light-emitting element 201 via the light emission control transistor 1501 and the driving transistor 202. Thus, the anode of the organic light-emitting element 201 is charged to increase the Vel. When the Vel becomes a potential equal to or higher than the light emission threshold voltage, the organic light-emitting element 201 emits light.

When the source of the driving transistor 202 has the Vdd 205, the gate potential of the driving transistor 202 increases by $\Delta V_2$ due to the influence of capacitive coupling between the gate and source and that between the gate and drain. $\Delta V_2$ is given by:

$$\Delta V_2 = \Delta Vd \cdot Cgd/(Cg+Cgd) \quad (3)$$

where $\Delta Vd$ represents a change amount of the drain voltage of the driving transistor 202 during a period from time t10 to time t11, Cgd represents the capacitance value of the first capacitive element 204, and Cg represents the gate capacitance of the driving transistor 202 except for Cgd, in other words, Cgd is the capacitance at the connection portion between the driving transistor 202 and the write transistor 203. Therefore, $\Delta V_2$ can be adjusted by the capacitance values of the first capacitive element 204 and the second capacitive element 1502.

If the Vsig written in each pixel is the same, the current flowing through the driving transistor 202 becomes constant by the threshold compensation operation during the period from time t5 to time t6 regardless of the variation in threshold voltage of the driving transistor 202. Therefore, it is possible to implement uniform light emission among pixels of the same light emitting color. A period from time t1 to time t10 is a non-light emission period.

At time t11, the potential of the signal line 107 is switched from the Vsig to the Vofs, and the following operation starts.

Figure 17:
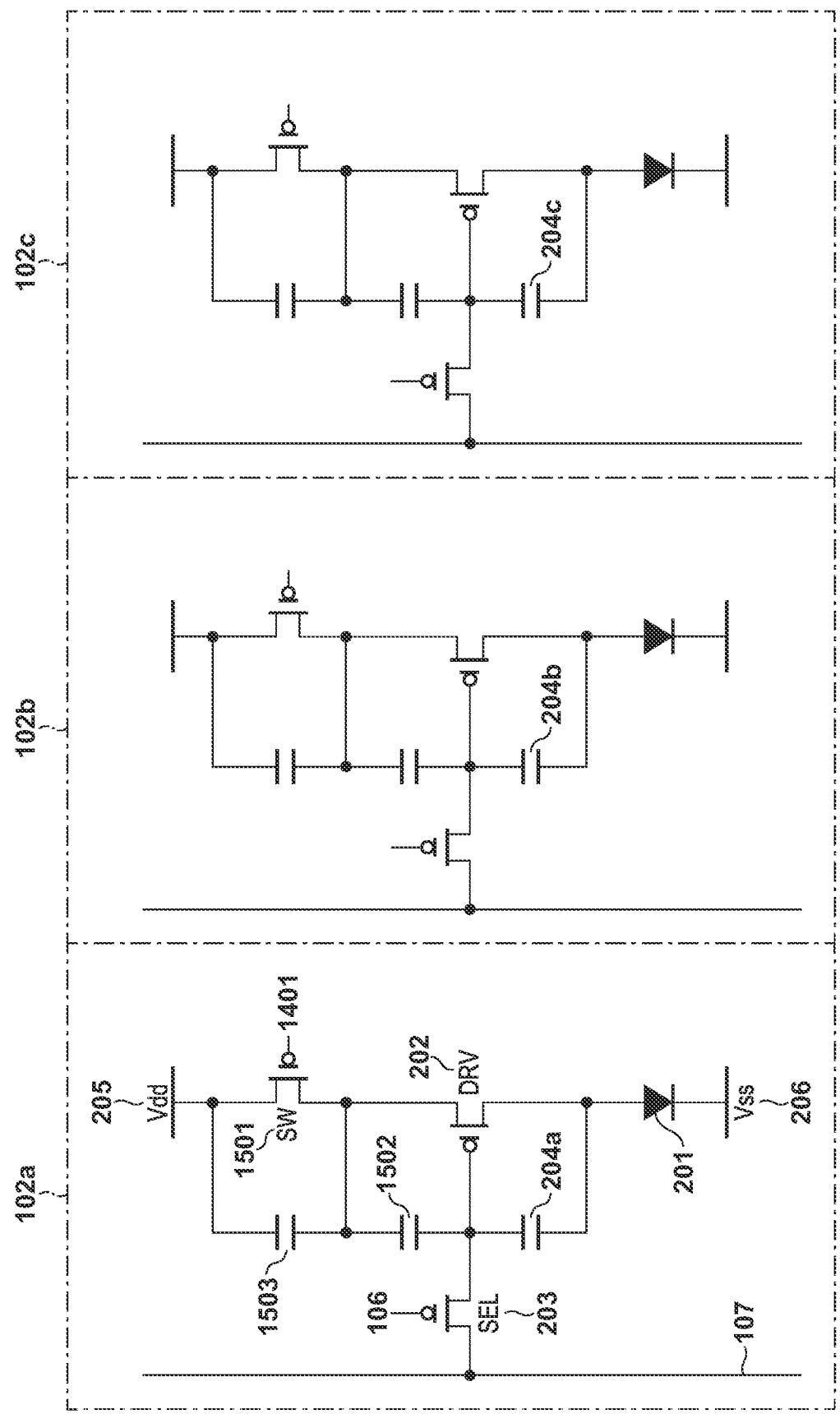
FIG. 17 is a circuit diagram of examples of pixels of three light emitting colors of the light emitting apparatus according to the second embodiment.

FIG. 17 is a circuit diagram corresponding to pixels of different light emitting colors. A pixel 102a is a pixel that emits green light, and includes a capacitive element 204a. A pixel 102b is a pixel that emits red light, and includes a capacitive element 204b. A pixel 102c is a pixel that emits blue light, and includes a capacitive element 204c. The magnitude relationship of the capacitances is represented by 204a<204b<204c.

Figure 18:
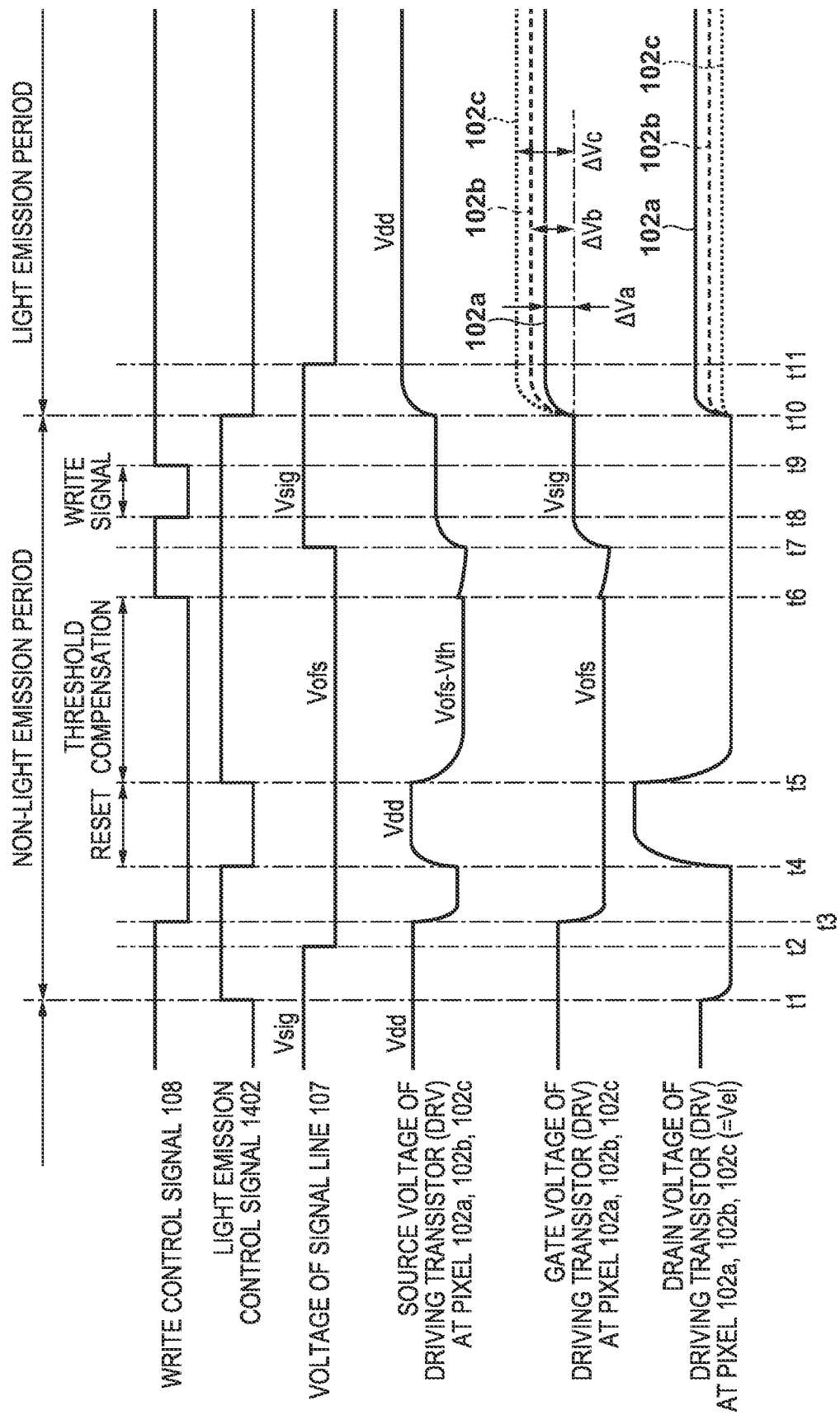
FIG. 18 is a timing chart of the pixels of the three light emitting colors of the light emitting apparatus according to the second embodiment.

FIG. 18 is a timing chart corresponding to the pixels of the different light emitting colors. As shown in FIG. 18, during the non-light emission period from time t1 to time t10, there are no large differences in the waveforms of the source voltage, gate voltage, and drain voltage of the driving transistor 202 among the pixels 102a, 102b, and 102c.

At time t10, a current is supplied to the organic light-emitting element 201 to increase the anode potential Vel of the organic light-emitting element 201. At this time, the gate voltage of the driving transistor 202 in each of the pixels 102a, 102b, and 102c increases by $\Delta Va$, $\Delta Vb$, or $\Delta Vc$ due to capacitive coupling between the gate and source and that between the gate and drain. The magnitude relationship of the gate voltages is represented by $\Delta Va<\Delta Vb<\Delta Vc$. Thus, the voltages Vgs of the driving transistors of the pixels have a relationship of "pixel 102a<pixel 102b<pixel 102c". As the Vgs is lower, the current amount of the driving transistor 202 is larger. Therefore, the current amounts of the driving transistors 202 in the pixels have a relationship of "pixel 102a>pixel 102b>pixel 102c". In this way, the conversion ratio between the signal voltage Vsig and the gate-source voltage of the driving transistor can be changed. To obtain white balance, with respect to the light-emitting element of a light emitting color whose luminance needs to be increased, the capacitance is changed to increase the peak current. With this arrangement, it is possible to obtain the same effect as in the first embodiment.

Third Embodiment

This embodiment will be described next with reference to FIGS. 19 to 23. This embodiment provides an arrangement including a reset transistor for resetting an organic light-emitting element by connecting the anode of the organic light-emitting element 201 to a Vss 206. Components different from other embodiments will mainly be described below.

Figure 19:
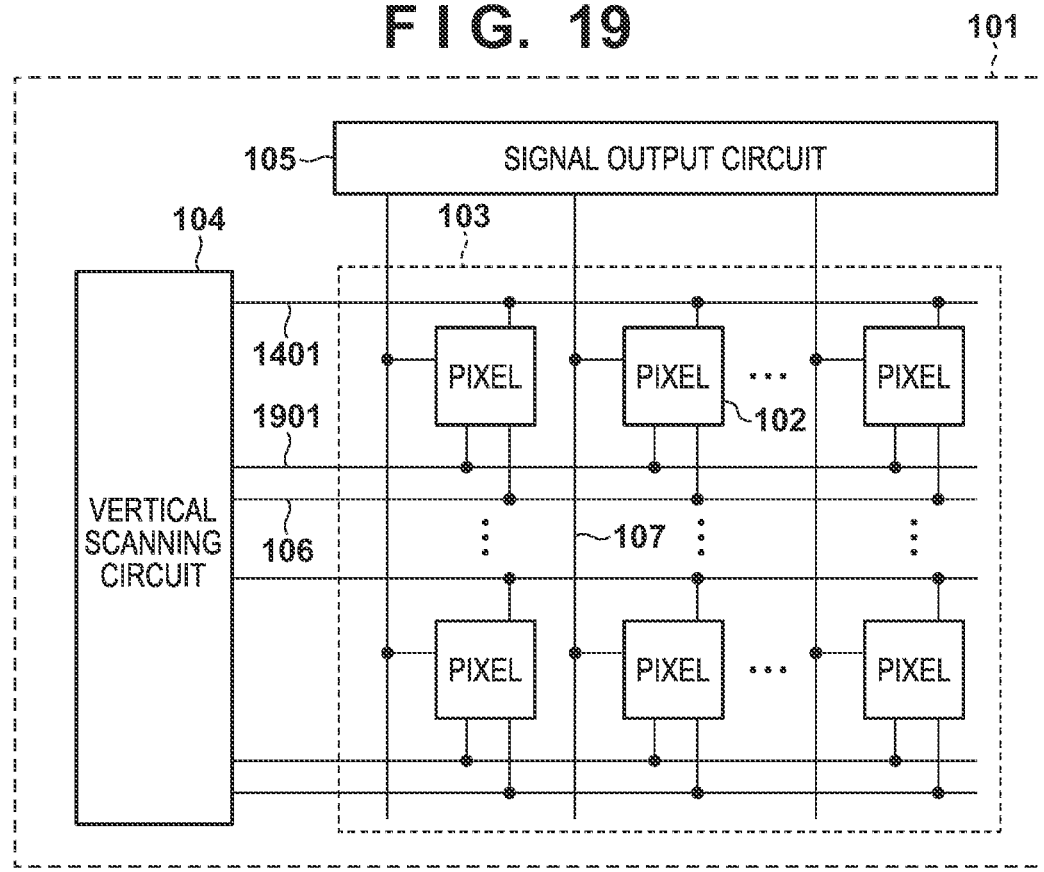
FIG. 19 is a view of an example of part of a light emitting apparatus according to the third embodiment.

FIG. 19 is a view showing an outline of an example of part of a light emitting apparatus according to this embodiment. As shown in FIG. 19, in a pixel array portion 103, a third scanning line 1901 is arranged for each pixel row in a row direction. Each third scanning line 1901 is connected to the output terminal of a corresponding row of a vertical scanning circuit 104, and supplies a reset signal to each pixel 102.

Figure 20:
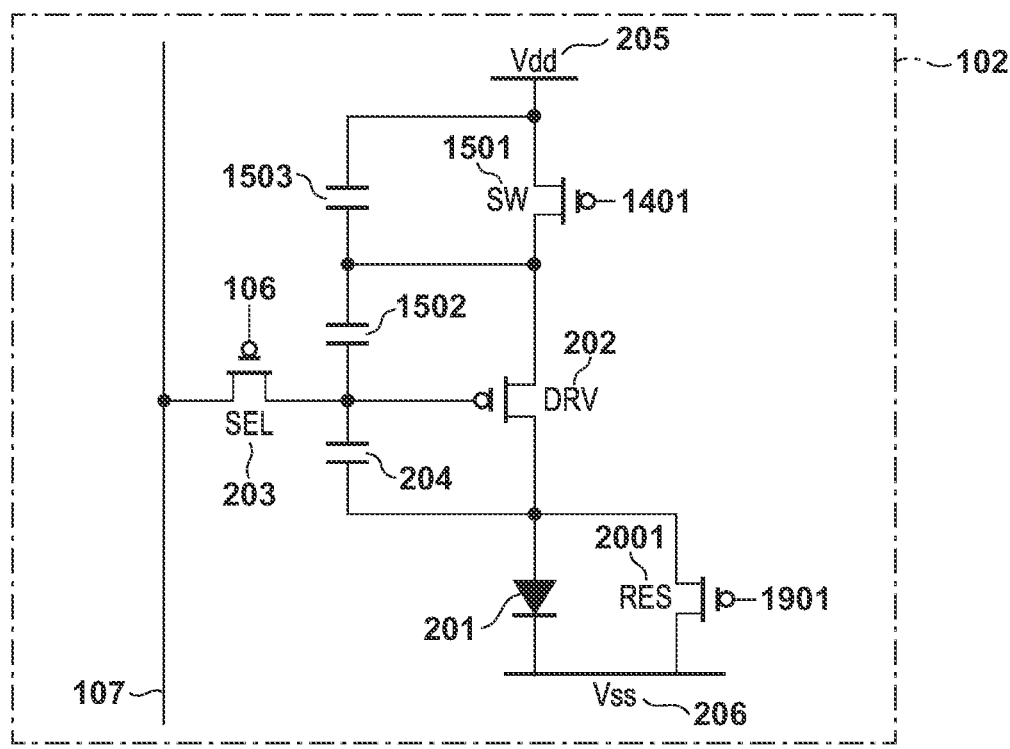
FIG. 20 is a circuit diagram of an example of a pixel of the light emitting apparatus according to the third embodiment.

FIG. 20 is a circuit diagram of an example of a pixel of the organic light emitting apparatus shown in FIG. 19. As shown in FIG. 20, one (the source in this example) of the source and drain of a reset transistor 2001 is connected to one (the drain in this example) of the source and drain of a driving transistor 202. The other of the reset transistor 2001 is connected to the Vss 206. The gate of the reset transistor 2001 is connected to the third scanning line 1901. During a non-light emission period, the anode of the organic light-emitting element 201 can be connected to the Vss 206 by turning on the reset transistor 2001, thereby setting the organic light-emitting element 201 in a non-light emission state.

Figure 21:
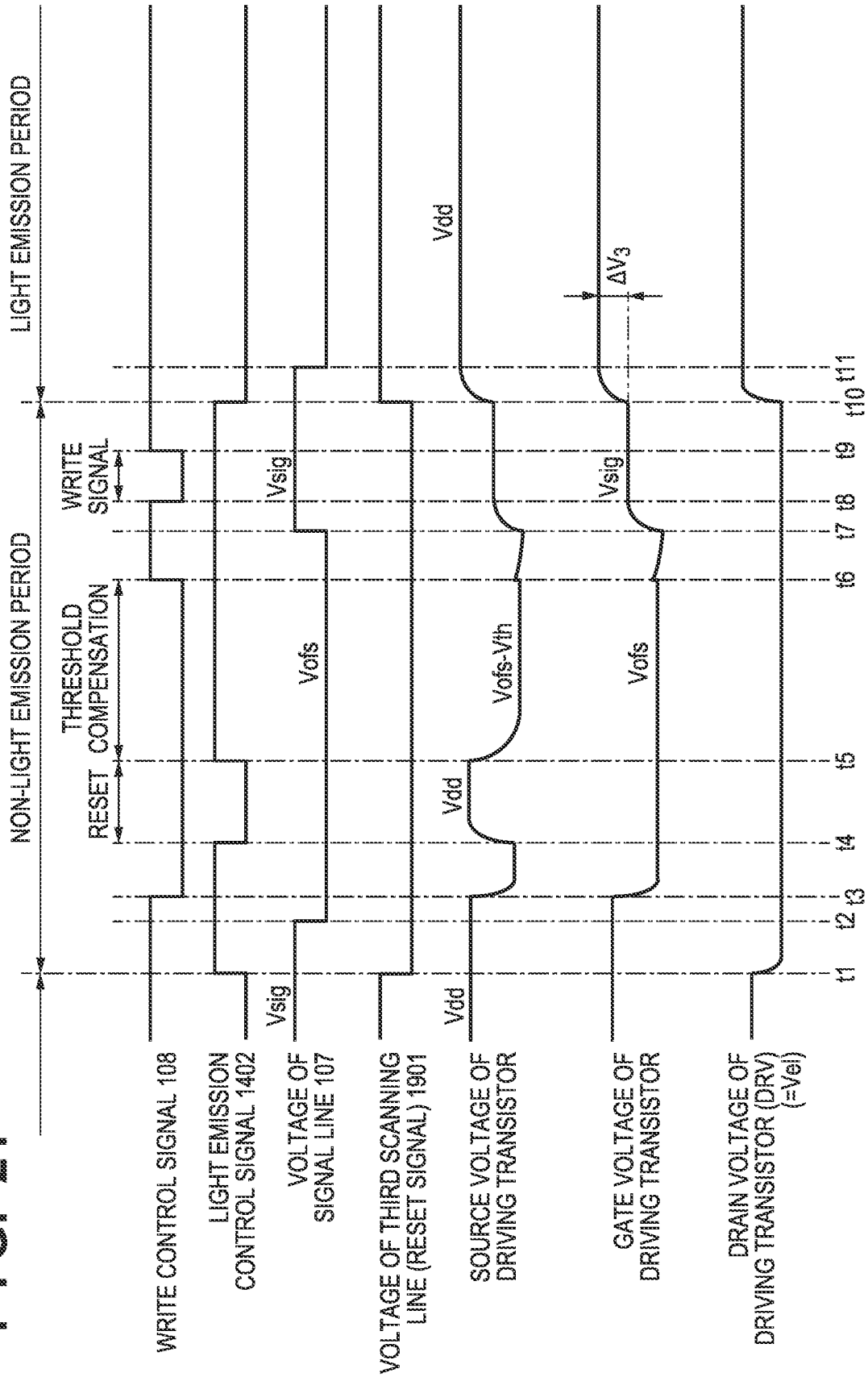
FIG. 21 is a timing chart of the light emitting apparatus according to the third embodiment.

FIG. 21 is a timing chart of the light emitting apparatus according to this embodiment. Referring to FIG. 21, at time t1, when voltage of the third scanning line 1901 transitions from High to Low, the reset transistor 2001 is set in the ON state.

At time t10, when the voltage of the third scanning line 1901 transitions from Low to High, the reset transistor 2001 is set in the OFF state.

Figure 22:
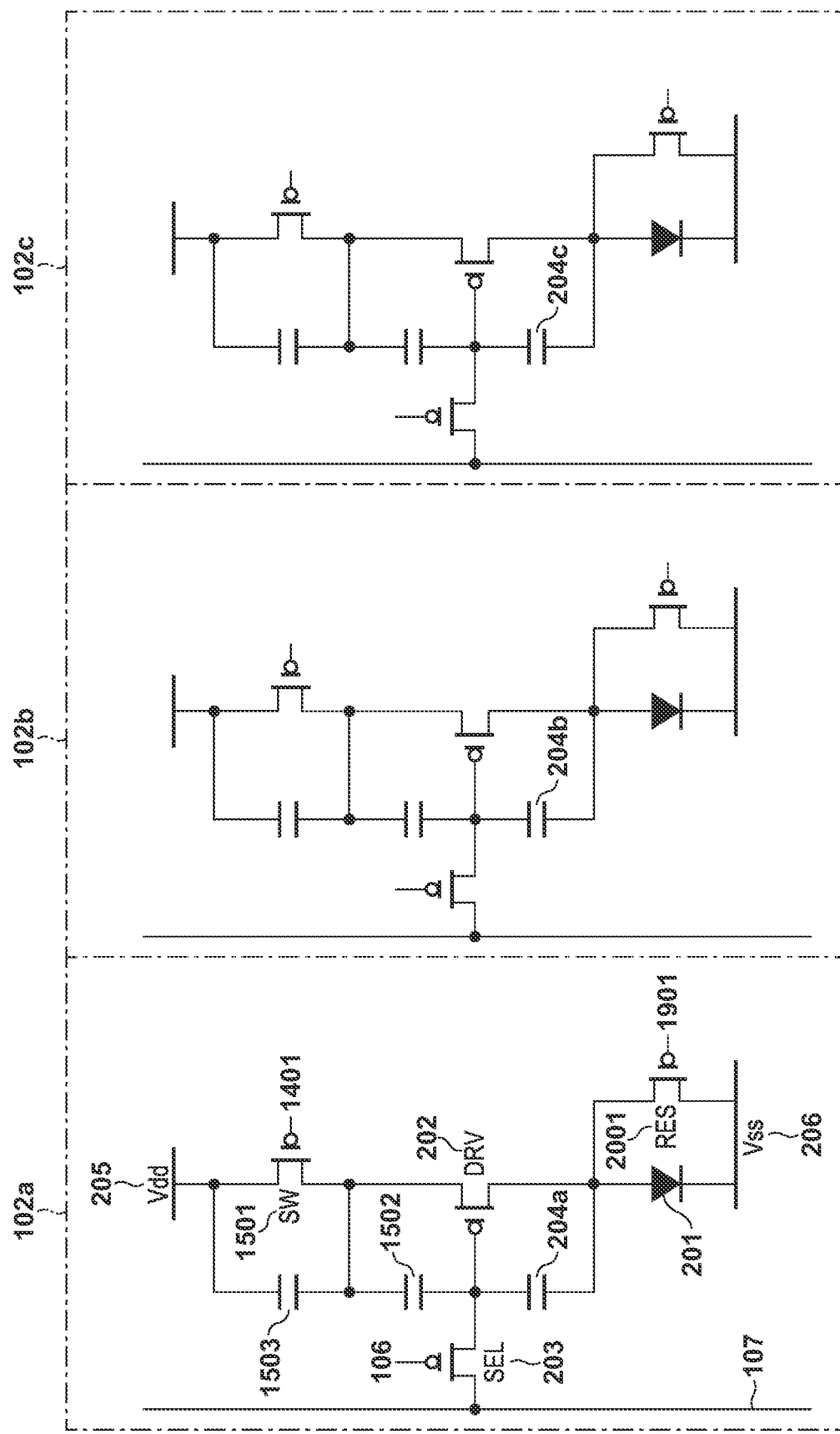
FIG. 22 is a circuit diagram of examples of pixels of three light emitting colors of the light emitting apparatus according to the third embodiment.

Therefore, during a period from time t1 to t10, an anode potential Vel of the organic light-emitting element 201 becomes a voltage almost equal to the Vss 206, and thus the organic light-emitting element 201 is set in the non-light emission state. FIG. 22 is a circuit diagram corresponding to pixels of different light emitting colors. A pixel 102a is a pixel that emits green light, and includes a capacitive element 204a. A pixel 102b is a pixel that emits red light, and includes a capacitive element 204b. A pixel 102c is a pixel that emits blue light, and includes a capacitive element 204c. The magnitude relationship of the capacitances is represented by 204a<204b<204c. In this embodiment as well, the luminance of each light emitting color is adjusted by the capacitance.

Figure 23:
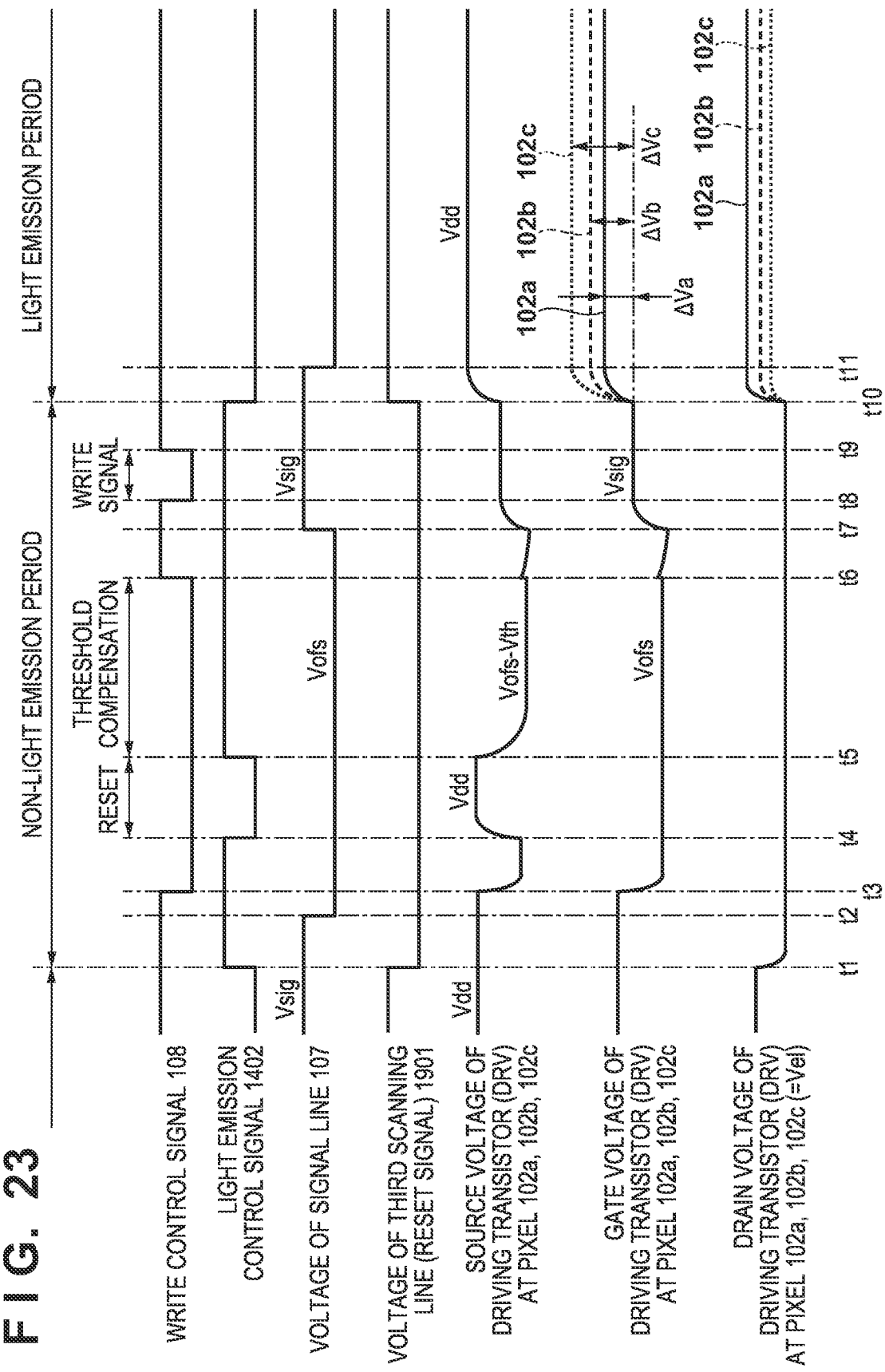
FIG. 23 is a timing chart of the pixels of the three light emitting colors of the light emitting apparatus according to the third embodiment.

FIG. 23 is a timing chart corresponding to the pixels of the different light emitting colors. As shown in FIG. 23, during the period from time t1 to time t10, in any of the pixels of the light emitting colors, the Vel becomes a voltage almost equal to the Vss 206, and thus the organic light-emitting element 201 is set in the non-light emission state. With the arrangement according to this embodiment, it is possible to implement a high-contrast display apparatus.

Fourth Embodiment

Arrangement Example 1 according to this embodiment will be described next with reference to FIGS. 24 to 29. This embodiment provides an arrangement in which the gate-source capacitance of a driving transistor is different for each light emitting color. Components different from other embodiments will mainly be described below.

Figure 24:
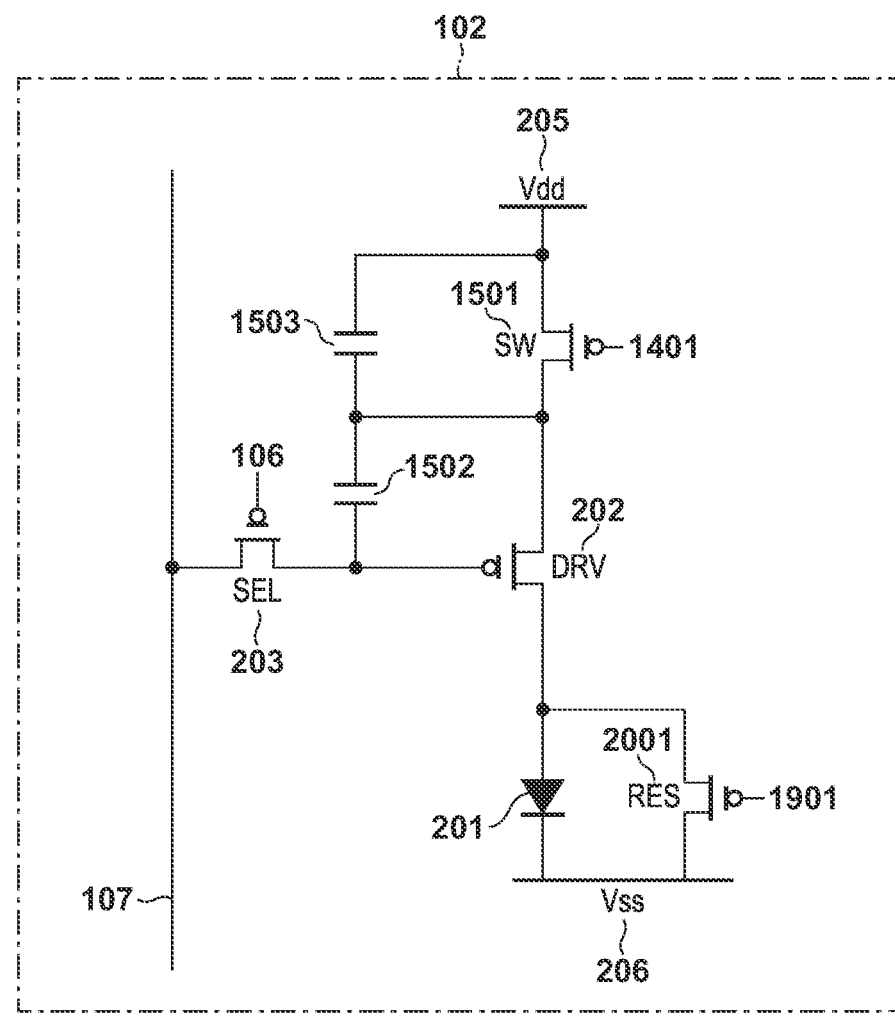
FIG. 24 is a circuit diagram of an example of a pixel of a light emitting apparatus according to the fourth embodiment.

FIG. 24 is a circuit diagram of an example of a pixel of an organic light emitting apparatus shown in FIG. 19. In this embodiment, no first capacitive element 204 is connected. Arrangement Example 1 according to this embodiment will now be described.

Figure 25:
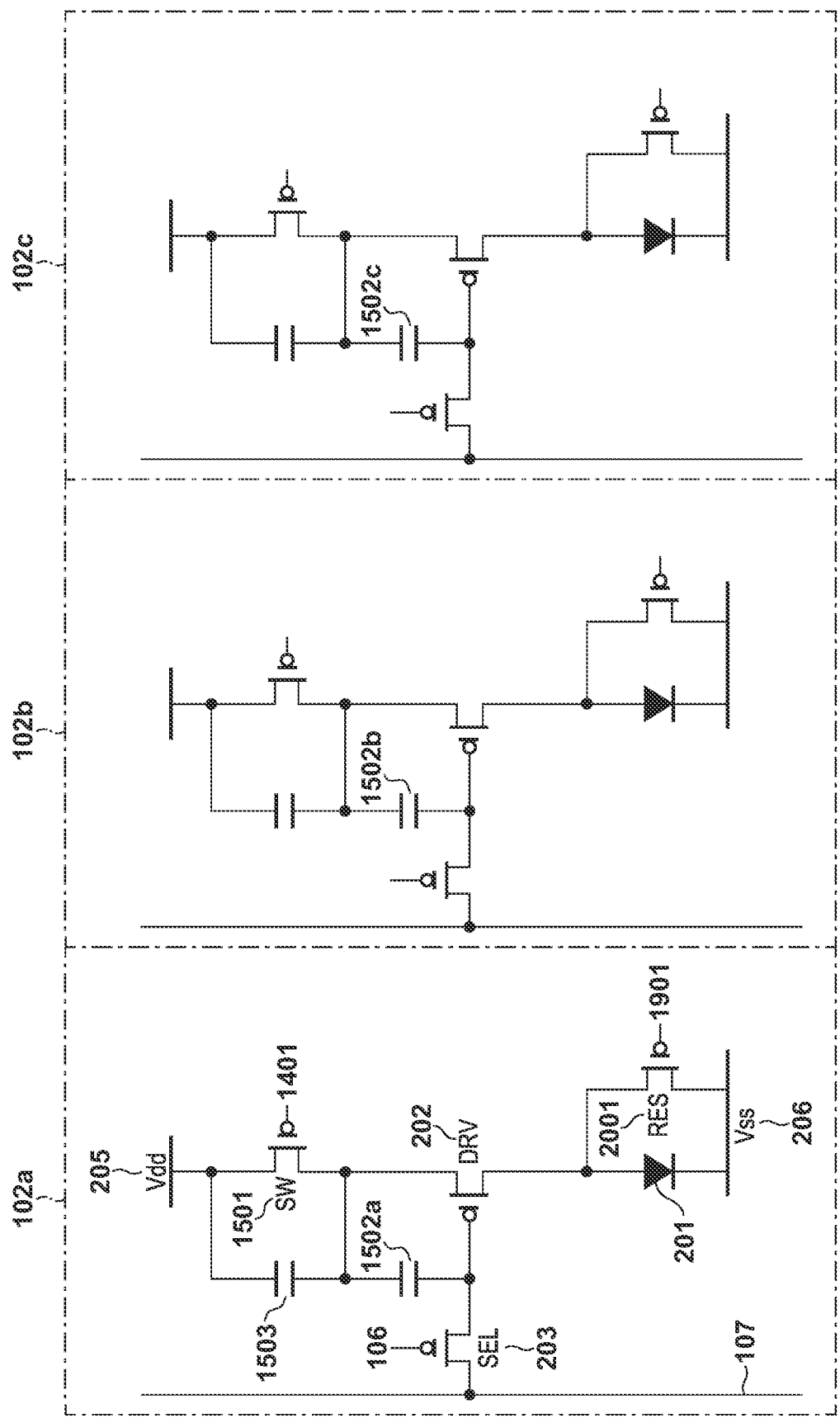
FIG. 25 is a circuit diagram of examples of pixels of three light emitting colors of the light emitting apparatus according to the fourth embodiment.

FIG. 25 is a circuit diagram corresponding to pixels of different light emitting colors. A pixel 102a is a pixel that emits green light, and includes a capacitive element 1502a. A pixel 102b is a pixel that emits red light, and includes a capacitive element 1502b. A pixel 102c is a pixel that emits blue light, and includes a capacitive element 1502c. In this embodiment, the magnitude relationship of the capacitances is represented by 1502a<1502b<1502c.

Figure 26:
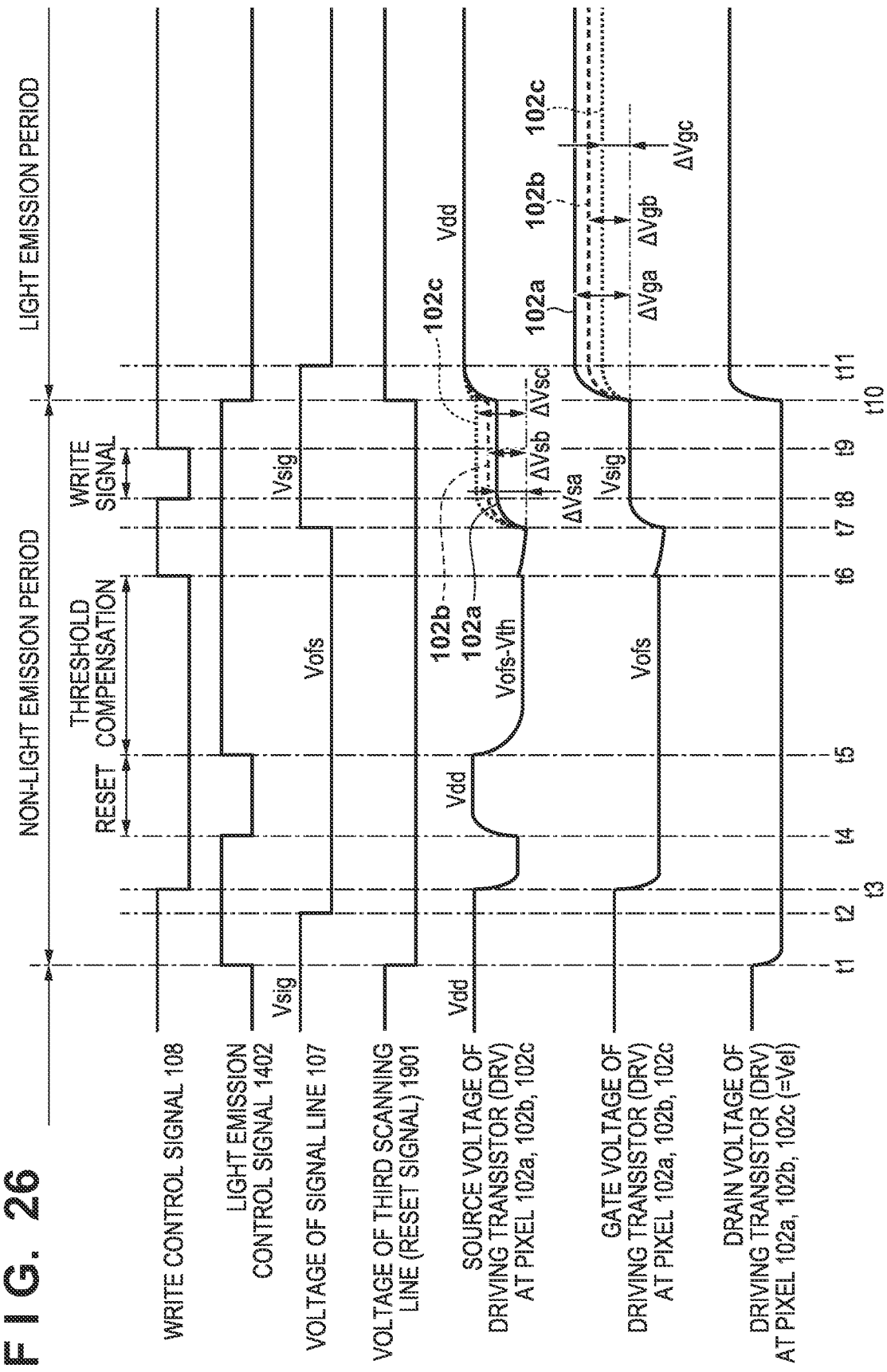
FIG. 26 is a timing chart of the pixels of the three light emitting colors of the light emitting apparatus according to the fourth embodiment.

FIG. 26 is a timing chart of the light emitting apparatus according to this embodiment. As shown in FIG. 26, during a period from time t1 to time t7, the same waveforms as in FIG. 23 are obtained.

At time t7, the gate voltage of a driving transistor 202 changes from a voltage almost equal to a Vofs to a Vsig, and thus the source voltage increases due to capacitive coupling between the gate and source of the driving transistor 202. In the pixels 102a, 102b, and 102c, source voltages Vsa, Vsb, and Vsc of the driving transistors 202 are given by Vsa=Vofs−Vth+ΔVsa, Vsb=Vofs−Vth+ΔVsb, and Vsc=Vofs−Vth+ΔVsc, respectively. In this case, ΔVsa, ΔVsb, and ΔVsc are, respectively, given by:

$$\Delta Vsa = (Vsig - Vofs) * C2a/(Cs + C2a) \quad (4)$$

$$\Delta Vsb = (Vsig - Vofs) * C2b/(Cs + C2b) \quad (5)$$

$$\Delta Vsc = (Vsig - Vofs) * C2c/(Cs + C2c) \quad (6)$$

where C2a represents the capacitance value of the capacitive element 1502a, C2b represents the capacitance value of the capacitive element 1502b, C2c represents the capacitance value of the capacitive element 1502c, and Cs represents the source capacitance of the driving transistor 202 except for the gate-source capacitance.

At time t10, when a light emission control signal 1402 transitions from High to Low, a light emission control transistor 1501 is set in the ON state. At this time, the source of the driving transistor 202 changes to a voltage almost equal to a Vdd 205, and thus the gate voltage increases due to capacitive coupling between the gate and source of the driving transistor 202. In the pixels 102a, 102b, and 102c, gate voltages Vga, Vgb, and Vgc of the driving transistors 202 are given by Vga=Vsig+ΔVga, Vgb=Vsig+ΔVgb, and Vgc=Vsig+ΔVgc, respectively. In this case, ΔVga, ΔVgb, and ΔVgc are, respectively, given by:

$$\Delta Vga = (Vdd - Vsa) * C2a/(Cg + C2a) \quad (7)$$

$$\Delta Vgb = (Vdd - Vsb) * C2b/(Cg + C2b) \quad (8)$$

$$\Delta Vgc = (Vdd - Vsc) * C2c/(Cg + C2c) \quad (9)$$

where Cg represents the gate capacitance of the driving transistor 202 except for the gate-source capacitance.

When Cg represents the parasitic capacitance between the gate and drain of the driving transistor 202 and the parasitic capacitance between the gate of a write transistor 203 and that of the driving transistor 202, Cg is assumed to be sufficiently small with respect to C2a, C2b, and C2c.

As described above, Vsa, Vsb, and Vsc have relationships of Vsa=Vofs−Vth+ΔVsa, Vsb=Vofs−Vth+ΔVsb, and Vsc=Vofs−Vth+ΔVsc, respectively. Therefore, using equations (4), (5), and (6), equations (7), (8), and (9) are, respectively, represented by:

$$\Delta Vga = Vdd - Vsa = Vdd - \{Vofs - Vth + (Vsig - Vofs) * C2a/(Cs + C2a)\} \quad (10)$$

$$\Delta Vgb = Vdd - Vsb = Vdd - \{Vofs - Vth + (Vsig - Vofs) * C2b/(Cs + C2b)\} \quad (11)$$

$$\Delta Vgc = Vdd - Vsc = Vdd - \{Vofs - Vth + (Vsig - Vofs) * C2c/(Cs + C2c)\} \quad (12)$$

When the magnitude relationship of the capacitance values is represented by C2a<C2b<C2c and thus Vsig>Vofs holds, ΔVga>ΔVgb>ΔVgc is obtained. Therefore, the gate voltages during a light emission period have a relationship of "Vga>Vgb>Vgc", and the current amounts of the driving transistors 202 have a relationship of "pixel 102a<pixel 102b<pixel 102c". The currents can be controlled by the capacitances of the capacitive elements 1502a to 1502c. It is thus possible to adjust the peak current by the capacitance of the capacitive elements 1502a to 1502c to obtain white balance.

When Vsig=Vofs holds, Vga=Vgb=Vgc is obtained, and the current amounts of the driving transistors 202 have a relationship of "pixel 102a=pixel 102b=pixel 102c".

When Vsig<Vofs holds, Vga<Vgb<Vgc is obtained, and the current amounts of the driving transistors 202 have a relationship of "pixel 102a>pixel 102b>pixel 102c".

Figure 27:
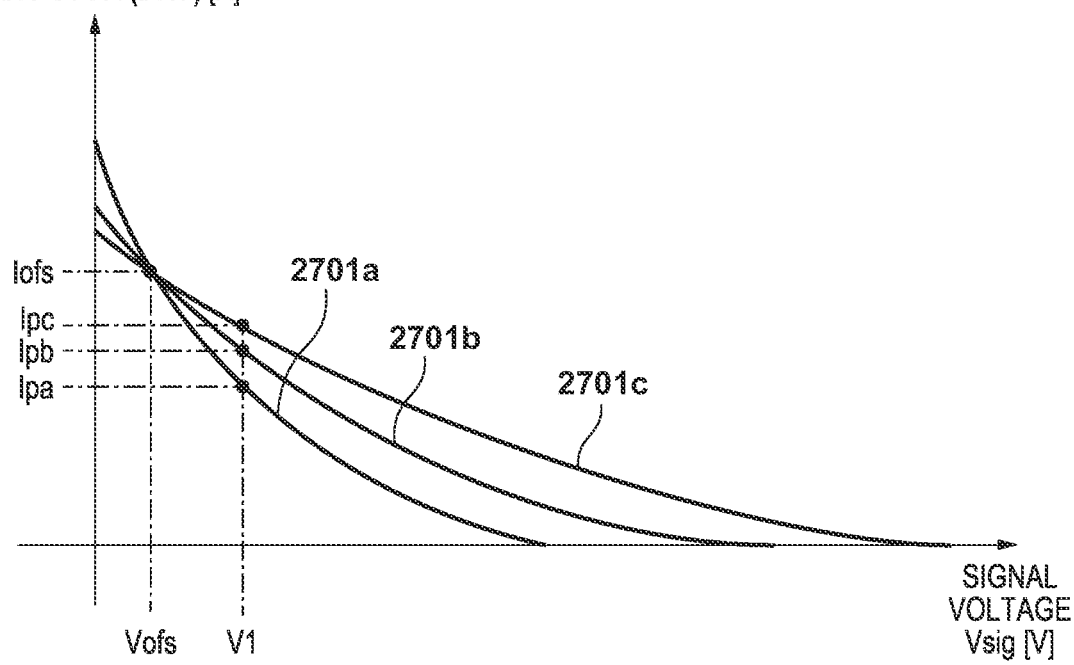
FIG. 27 is a graph showing the electrical characteristics of the pixels of the three light emitting colors of the light emitting apparatus according to the fourth embodiment.

FIG. 27 shows current characteristics 2701a, 2701b, and 2701c of the pixels 102a, 102b, and 102c with respect to the Vsig. At a predetermined signal voltage V1, the pixel 102a has the peak current Ipa, the pixel 102b has the peak current Ipb, and the pixel 102c has the peak current Ipc, and then Ipa<Ipb<Ipc holds. It is possible to control the peak luminances in the pixels 102a (green), 102b (red), and 102c (blue) by appropriately adjusting the capacitance values of the capacitive elements 1502a, 1502b, and 1502c.

However, assume that when Vsig=Vofs holds, the current of the driving transistor 202 is an Iofs. In this case, when the peak current of one of the pixels of the light emitting colors is equal to the Iofs, Ipa=Ipb=Ipc is obtained, and thus it is impossible to obtain appropriate white balance. In this embodiment, this problem can be solved by applying different voltages Vofs to the pixels of the light emitting colors. A practical method will be described below.

Figure 28:
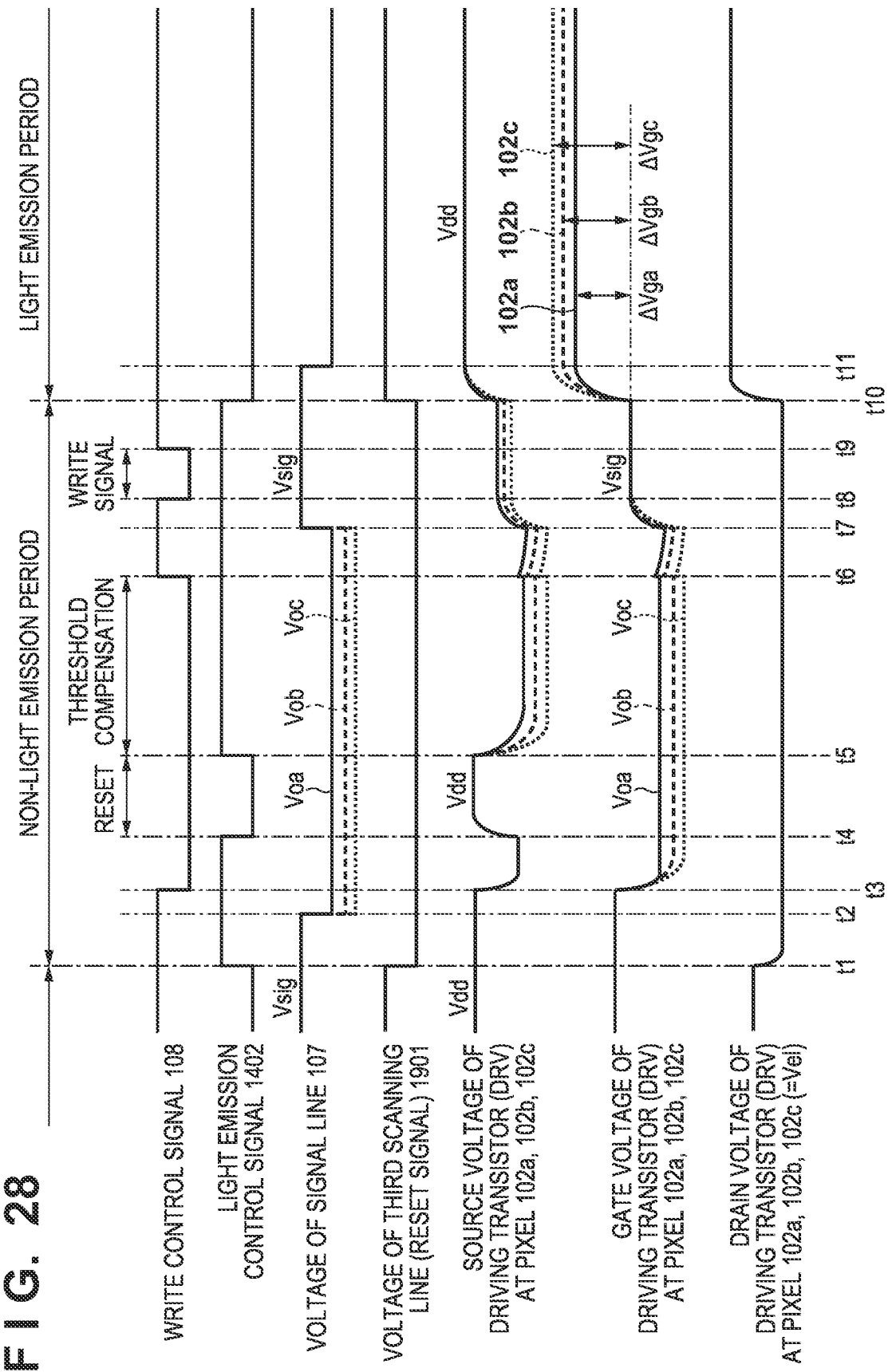
FIG. 28 is a timing chart of the pixels of the three light emitting colors of the light emitting apparatus according to the fourth embodiment.

FIG. 28 is a timing chart of the light emitting apparatus according to this embodiment, that considers solving of the above-described problem. As shown in FIG. 28, at time t2, the threshold compensation voltages Vofs to be written in the pixels 102a, 102b, and 102c are represented by Voa, Vob, and Voc, respectively, and their magnitude relationship is represented by Voa>Vob>Voc.

Therefore, equations (10), (11), and (12) are, respectively, represented by:

$$\Delta Vga = Vdd - \{(Voa - Vth + (Vsig - Voa)*Ca/(Cs+Ca)\} \quad (13)$$

$$\Delta Vgb = Vdd - \{(Vob - Vth + (Vsig - Vob)*Cb/(Cs+Cb)\} \quad (14)$$

$$\Delta Vgc = Vdd - \{(Voc - Vth + (Vsig - Voc)*Cc/(Cs+Cc)\} \quad (15)$$

As Voa, Vob, and Voc are smaller, $\Delta Vga$, $\Delta Vgb$, and $\Delta Vgc$ are larger. Thus, the gate voltages Vga, Vgb, and Vgc during the light emission period also become large. Therefore, by appropriately adjusting Voa, Vob, and Voc so as to satisfy Vga<Vgb<Vgc, the peak currents of the driving transistors 202 satisfy Ipa>Ipb>Ipc (as shown in FIG. 29).

Figure 29:
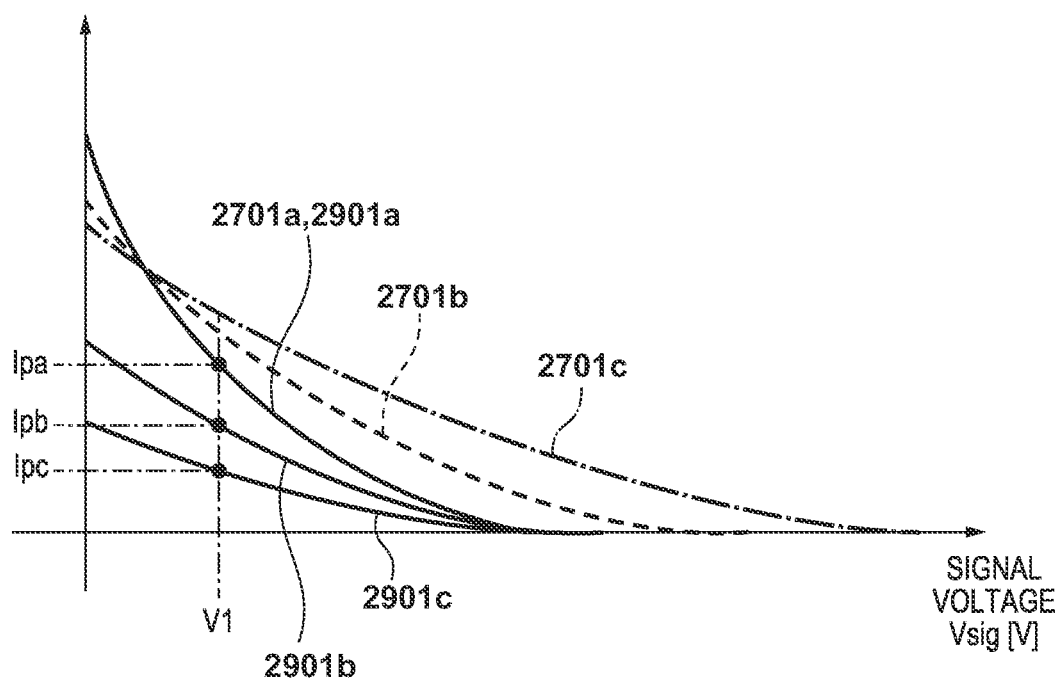
FIG. 29 is a graph showing the electrical characteristics of the pixels of the three light emitting colors of the light emitting apparatus according to the fourth embodiment.

FIG. 29 shows current characteristics 2901a, 2901b, and 2901c of the pixels 102a, 102b, and 102c with respect to the Vsig. At the predetermined signal voltage V1, the pixel 102a has the peak current Ipa, the pixel 102b has the peak current Ipb, and the pixel 102c has the peak current Ipc, and then Ipa>Ipb>Ipc holds. It is possible to control the peak luminances in the pixels 102a (green), 102b (red), and 102c (blue) by appropriately adjusting the threshold compensation voltages Voa, Vob, and Voc. With this arrangement, it is possible to obtain the same effect as in the third embodiment.

Arrangement Example 2 according to this embodiment will be described next with reference to FIG. 30. This example provides an arrangement in which the drain-source capacitance of the light emission control transistor 1501 is different for each light emitting color. Components different from Arrangement Example 1 will mainly be described below.

FIG. 30 is a circuit diagram corresponding to the pixels of the different light emitting colors. The pixel 102a is a pixel that emits green light, and includes a capacitive element 1503a. The pixel 102b is a pixel that emits red light, and includes a capacitive element 1503b. The pixel 102c is a pixel that emits blue light, and includes a capacitive element 1503c. The magnitude relationship of the capacitances is represented by 1503a>1503b>1503c.

Therefore, equations (13), (14), and (15) are, respectively, represented by:

$$\Delta Vga = Vdd - \{(Voa - Vth + (Vsig - Voa)*C2/(Cs+C3a+C2)\} \quad (16)$$

$$\Delta Vgb = Vdd - \{(Vob - Vth + (Vsig - Vob)*C2/(Cs+C3b+C2)\} \quad (17)$$

$$\Delta Vgc = Vdd - \{(Voc - Vth + (Vsig - Voc)*C2/(Cs+C3c+C2)\} \quad (18)$$

where C2 represents the capacitance value of the capacitive element 1502, C3a represents the capacitance value of the capacitive element 1503a, C3b represents the capacitance value of the capacitive element 1503b, C3c represents the capacitance value of the capacitive element 1503c, and Cs represents the source capacitance of the driving transistor 202 except for the gate-source capacitance and source-Vdd capacitance.

Increasing C3a, C3b, and C3c with respect to $\Delta Vga$, $\Delta Vgb$, and $\Delta Vgc$ according to equations (16), (17), and (18) is equivalent to decreasing C2a, C2b, and C2c in terms of the qualitative increase/decrease relationship.

Therefore, it is possible to control the peak luminances in the pixels 102a, 102b, and 102c by appropriately adjusting the capacitance values of the capacitive elements 1503a, 1503b, and 1503c and the threshold compensation voltages Voa, Vob, and Voc. With this arrangement, it is possible to obtain the same effect as in Arrangement Example 1.

The above-described embodiments and arrangement examples can also be used in combination appropriately.

Fifth Embodiment

The light emitting apparatus according to each of the above-described embodiments can be used as a constituent member of an illumination apparatus or a display apparatus of an apparatus by making use of light emission characteristics. This embodiment will describe applications of the light emitting apparatus according to the present invention. However, the arrangement of an organic light-emitting element will first be described in detail.

[Arrangement of Light Emitting Apparatus]

An organic light-emitting element is provided by forming an anode, an organic compound layer, and a cathode on a substrate. A protection layer, a color filter, or the like can be provided on the cathode. If a color filter is provided, a planarizing layer can be provided between the protection layer and the color filter. The planarizing layer can be made of acrylic resin or the like.

Quartz, glass, a silicon wafer, a resin, a metal, or the like may be used as a substrate. Furthermore, a switching element such as a transistor and a wiring may be provided on the substrate, and an insulating layer may be provided thereon. The insulating layer may be made of any material as long as a contact hole for ensuring conductivity between the anode and the wiring can be formed and insulation from the unconnected wiring can be ensured. For example, a resin such as polyimide, silicon oxide, silicon nitride, or the like can be used.

A pair of electrodes can be used as the electrodes of the organic light-emitting element. The pair of electrodes can be an anode and a cathode. When an electric field is applied in the direction in which the organic light-emitting element emits light, the electrode having a high potential is the anode, and the other is the cathode. It can also be said that the electrode that supplies holes to the light emitting layer is the anode and the electrode that supplies electrons is the cathode.

As the constituent material of the anode, a material having a work function as large as possible can be used. For example, a metal such as gold, platinum, silver, copper, nickel, palladium, cobalt, selenium, vanadium, or tungsten, a mixture containing some of them, or an alloy obtained by combining some of them can be used. Alternatively, a metal oxide such as tin oxide, zinc oxide, indium oxide, indium tin oxide (ITO), or zinc indium oxide can be used. Furthermore, a conductive polymer such as polyaniline, polypyrrole, or polythiophene can also be used.

One of these electrode materials may be used singly, or two or more of them may be used in combination. The anode may be formed by a single layer or a plurality of layers.

When the anode is used as a reflective electrode, for example, chromium, aluminum, silver, titanium, tungsten, molybdenum, an alloy thereof, a stacked layer thereof, or the like can be used. When the anode is used as a transparent electrode, an oxide transparent conductive layer made of indium tin oxide (ITO), indium zinc oxide, or the like can be used, but the present invention is not limited thereto. A photolithography technique can be used to form the electrode.

On the other hand, as the constituent material of the cathode, a material having a small work function can be used. Examples of the material include an alkali metal such as lithium, an alkaline earth metal such as calcium, a metal such as aluminum, titanium, manganese, silver, lead, or chromium, and a mixture containing some of them. Alternatively, an alloy obtained by combining these metals can also be used. For example, a magnesium-silver alloy, an aluminum-lithium alloy, an aluminum-magnesium alloy, a silver-copper alloy, a zinc-silver alloy, or the like can be used. A metal oxide such as indium tin oxide (ITO) can also be used. One of these electrode materials may be used singly, or two or more of them may be used in combination. The cathode may have a single-layer structure or a multi-layer structure. Among others, silver is used appropriately. To suppress aggregation of silver, a silver alloy is used more appropriately. The ratio of the alloy is not limited as long as aggregation of silver can be suppressed. For example, the ratio may be 1:1.

The cathode may be a top emission element using an oxide conductive layer made of ITO or the like, or may be a bottom emission element using a reflective electrode made of aluminum (Al) or the like, and is not particularly limited. The method of forming the cathode is not particularly limited, but direct current sputtering or alternating current sputtering is used appropriately since the good film coverage is provided and the resistance is easily lowered.

A protection layer may be provided on the cathode. For example, by adhering glass provided with a moisture absorbent on the cathode, permeation of water or the like into the organic compound layer can be suppressed and occurrence of display defects can be suppressed. Furthermore, as another embodiment, a passivation film made of silicon nitride or the like may be provided on the cathode to suppress permeation of water or the like into the organic light emitting layer. The protection layer can be formed by forming the cathode, transferring it to another chamber without breaking the vacuum, and forming a silicon nitride film having a thickness of 2 µm by a CVD method. The protection layer may be provided using an atomic deposition method (ALD method) after forming a film using the CVD method.

A color filter may be provided on the protection layer. For example, a color filter considering the size of the organic light-emitting element may be provided on another substrate, and this substrate may be bonded to the substrate with the organic light-emitting element provided thereon. Alternatively, a color filter may be patterned on the above-described protection layer using a photolithography technique. The color filter can be formed from a polymeric material. A planarizing layer may be provided between the color filter and the protection layer. The planarizing layer can be formed from an organic compound, and can be made of a low-molecular material or a polymeric material. However, a polymetric material is more appropriate.

The planarizing layers may be provided above and below the color filter, and the same or different materials may be used for them. More specifically, examples of the material include polyvinyl carbazole resin, polycarbonate resin, polyester resin, ABS resin, acrylic resin, polyimide resin, phenol resin, epoxy resin, silicone resin, and urea resin.

A counter substrate can be provided on the planarizing layer. The counter substrate is called a counter substrate because it is provided at a position corresponding to the above-described substrate. The constituent material of the counter substrate can be the same as that of the above-described substrate.

The organic compound layer (hole injection layer, hole transport layer, electron blocking layer, light emitting layer, hole blocking layer, electron transport layer, electron injection layer, and the like) forming the organic light-emitting element according to an embodiment of the present invention is formed by the method to be described below.

The organic compound layer forming the organic light-emitting element according to the embodiment of the present invention can be formed by a dry process using a vacuum deposition method, an ionization deposition method, a sputtering method, a plasma method, or the like. Instead of the dry process, a wet process that forms a layer by dissolving a solute in an appropriate solvent and using a well-known coating method (for example, a spin coating method, a dipping method, a casting method, an LB method, an inkjet method, or the like) can be used.

Here, when the layer is formed by a vacuum deposition method, a solution coating method, or the like, crystallization or the like hardly occurs and excellent temporal stability is obtained. Furthermore, when the layer is formed using a coating method, it is possible to form the film in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, and urea resin. However, the binder resin is not limited to them.

One of these binder resins may be used singly as a homopolymer or a copolymer, or two or more of them may be used in combination. Furthermore, additives such as a well-known plasticizer, antioxidant, and an ultraviolet absorber may also be used as needed.

A display apparatus according to this embodiment will be described next with reference to the accompanying drawings.

Figure 31A:
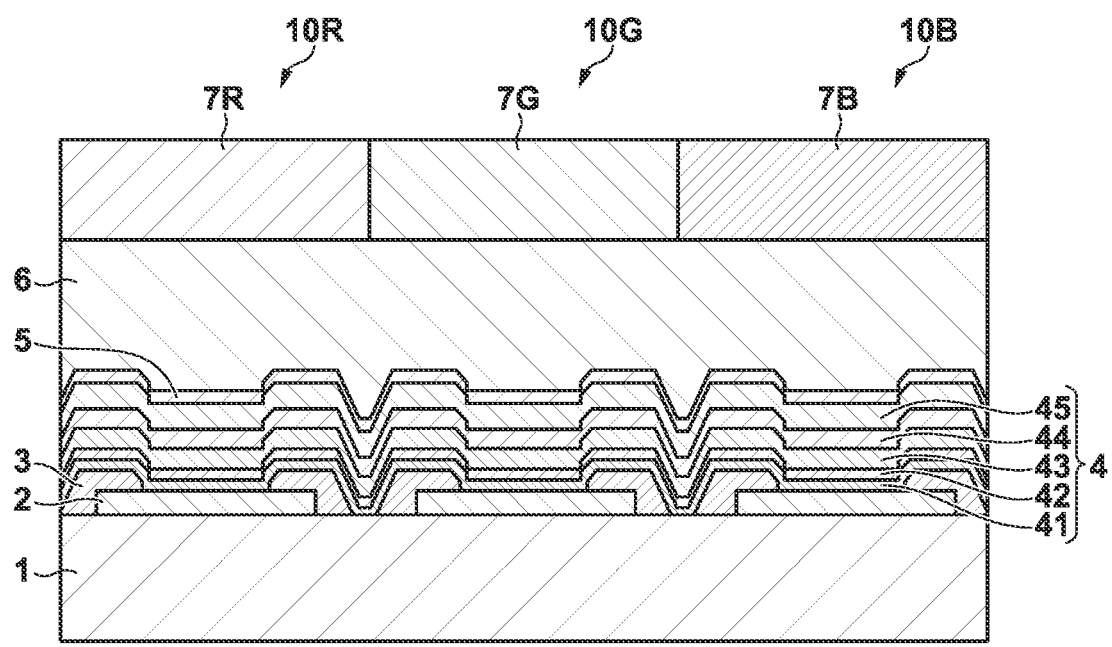
FIGS. 31A and 31B are schematic sectional views of a display apparatus using an organic light-emitting element.
Figure 31B:
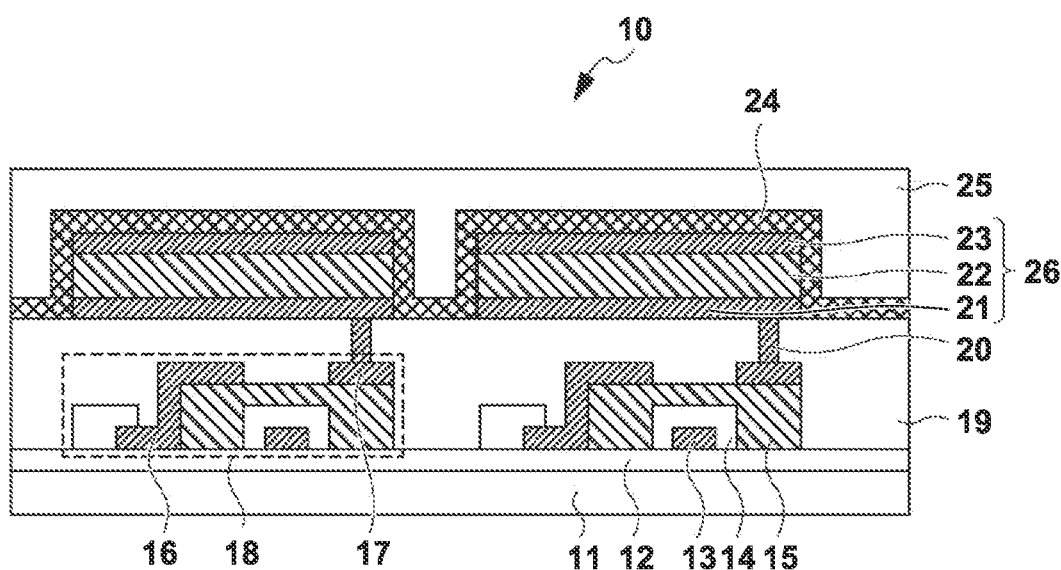

FIGS. 31A and 31B are schematic sectional views showing an example of a light emitting apparatus including the organic light-emitting element and the transistor connected to it. The transistor is an example of an active element. The transistor may be a thin-film transistor (TFT).

FIG. 31A shows examples of pixels of the light emitting apparatus. Assume that there are provided pixels 10R, 10G, and 10B for light emitting colors. The light emitting colors may be discriminated by wavelengths of light components emitted from the light emitting layers, or light emitted from each pixel may be selectively transmitted or undergo color conversion by a color filter or the like. An example using a color filter will now be described. Each pixel includes a reflective electrode 2 as the first electrode on an interlayer insulating layer 1, an insulating layer 3 covering the end of the reflective electrode 2, an organic compound layer 4 covering the first electrode and the insulating layer, a transparent electrode 5, a protection layer 6, and a color filter 7.

The interlayer insulating layer 1 can include a transistor and a capacitive element arranged in the interlayer insulating layer 1 or a layer below it. The transistor and the first electrode can electrically be connected via a contact hole (not shown) or the like.

The insulating layer 3 is also called a bank or a pixel separation film. The insulating layer 3 covers the end of the first electrode, and is arranged to surround the first electrode. A portion where no insulating layer is arranged contacts the organic compound layer 4 to form a light emission region.

The organic compound layer 4 includes a hole injection layer 41, a hole transport layer 42, a first light emitting layer 43, a second light emitting layer 44, and an electron transport layer 45.

The second electrode 5 may be a transparent electrode, a reflective electrode, or a translucent electrode.

The protection layer 6 suppresses permeation of water into the organic compound layer. The protection layer is shown as a single layer but may include a plurality of layers. Each layer can be an inorganic compound layer or an organic compound layer.

The color filter 7 is divided into color filters 7R, 7G, and 7B by colors. The color filters can be formed on the planarizing layer (not shown). A resin protection layer (not shown) can be provided on the color filters. The color filters can be formed on the protection layer 6. Alternatively, the color filters can be provided on the counter substrate such as a glass substrate, and then the substrate may be bonded.

A light emitting apparatus 10 shown in FIG. 31B is provided with a substrate 11 of glass, silicon, or the like and an insulating layer 12 thereon. The insulating layer 12 may be a moisture-proof film. An active element 18 such as a TFT is arranged on the insulating layer, and a gate electrode 13, a gate insulating film 14, and a semiconductor layer 15 of the active element are arranged. FIG. 31B shows two pixels but they are merely examples. The TFT 18 further includes the semiconductor layer 15, a drain electrode 16, and a source electrode 17. An insulating film 19 is provided on the TFT 18. The source electrode 17 and an anode 21 forming the organic light-emitting element are connected via a contact hole 20 formed in the insulating film.

Note that a method of electrically connecting the electrodes (anode and cathode) included in the organic light-emitting element and the electrodes (source electrode and drain electrode) included in the TFT is not limited to that shown in FIG. 31B. That is, one of the anode and cathode and one of the source electrode and drain electrode of the TFT are electrically connected.

In the light emitting apparatus 10 shown in FIG. 31B, an organic compound layer is illustrated as one layer. However, an organic compound layer 22 may include a plurality of layers. A first protection layer 24 and a second protection layer 25 are provided on a cathode 23 to suppress the degradation of the organic light-emitting element.

A transistor is used as a switching element in the light emitting apparatus 10 shown in FIG. 31B but may be used as another switching element. The transistor used in the light emitting apparatus 10 shown in FIG. 31B is not limited to a transistor using a single-crystal silicon wafer, and may be a thin-film transistor including an active layer on an insulating surface of a substrate. Examples of the active layer include single-crystal silicon, amorphous silicon, non-single-crystal silicon such as microcrystalline silicon, and a non-single-crystal oxide semiconductor such as indium zinc oxide and indium gallium zinc oxide.

The light emission luminance of the organic light-emitting element can be controlled by the TFT which is an example of a switching element, and the plurality of organic light-emitting elements can be provided in planes to display an image with the light emission luminances of the respective elements. Note that the switching element according to this embodiment is not limited to the TFT, and may be a transistor formed from low-temperature polysilicon or an active matrix driver formed on the substrate such as an Si substrate. The term "on the substrate" may mean "in the substrate". Whether to provide a transistor in the substrate or use a TFT is selected based on the size of the display unit. For example, if the size is about 0.5 inch, the organic light-emitting element may be provided on the Si substrate.

The light emitting apparatus according to the present invention can be used as a constituent member of an illumination apparatus or a display apparatus of an apparatus by making use of light emission characteristics. In addition, the light emitting apparatus is applicable to the exposure light source of an electrophotographic image forming apparatus, the backlight of a liquid crystal display apparatus, a light emitting apparatus including a color filter in a white light source, and the like. The organic light emitting apparatus may be an image information processing apparatus that includes an image input unit for inputting image information from an area CCD, a linear CCD, a memory card, or the like, and an information processing unit for processing the input information, and displays the input image on a display unit. In addition, a display apparatus included in an imaging apparatus or an inkjet printer can have a touch panel function. The driving type of the touch panel function may be an infrared type, a capacitance type, a resistive film type, or an electromagnetic induction type, and is not particularly limited. The display apparatus may be used for the display unit of a multifunction printer.

Figure 32:
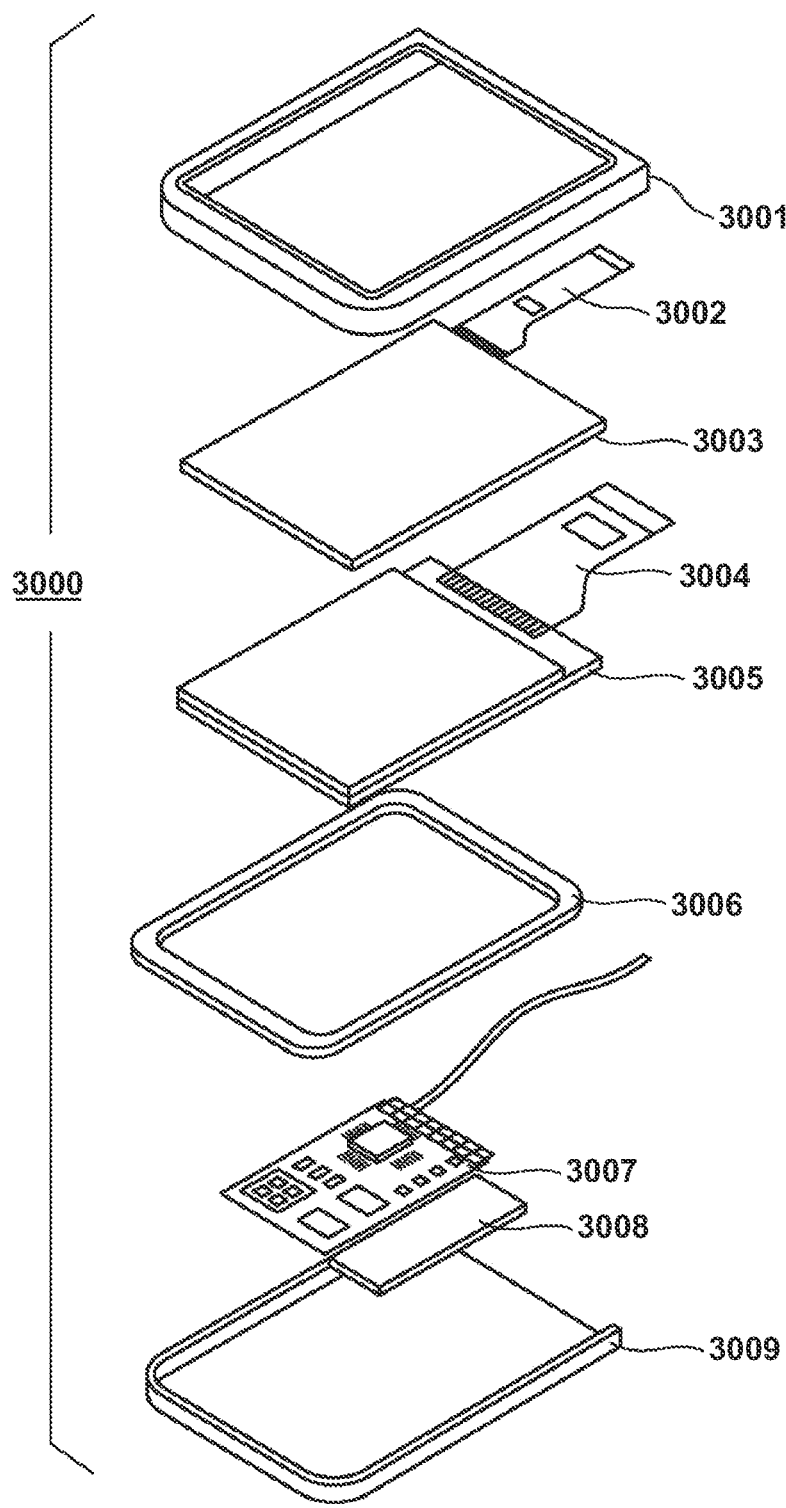
FIG. 32 is a schematic view showing an example of a display apparatus.

An application of the light emitting apparatus according to the present invention will be described in detail next. FIG. 32 is a schematic view showing an example of the display apparatus using the light emitting apparatus. A display apparatus 3000 can include a touch panel 3003, a display panel 3005, a frame 3006, a circuit board 3007, and a battery 3008 between an upper cover 3001 and a lower cover 3009. Flexible printed circuits (FPCs) 3002 and 3004 are respectively connected to the touch panel 3003 and the display panel 3005. Transistors are arranged on the circuit board 3007. The battery 3008 is unnecessary if the display apparatus is not a portable apparatus. Even when the display apparatus is a portable apparatus, the battery 3008 may be arranged at another position.

The light emitting apparatus according to the present invention can also be used as a display unit of the imaging apparatus including an optical unit having a plurality of lenses, and an imaging element for receiving light having passed through the optical unit. The imaging apparatus can include a display unit for displaying information acquired by the imaging element. In addition, the display unit can be either a display unit exposed outside the imaging apparatus, or a display unit arranged in the finder. The imaging apparatus can be a digital camera or a digital video camera.

Figure 33A:
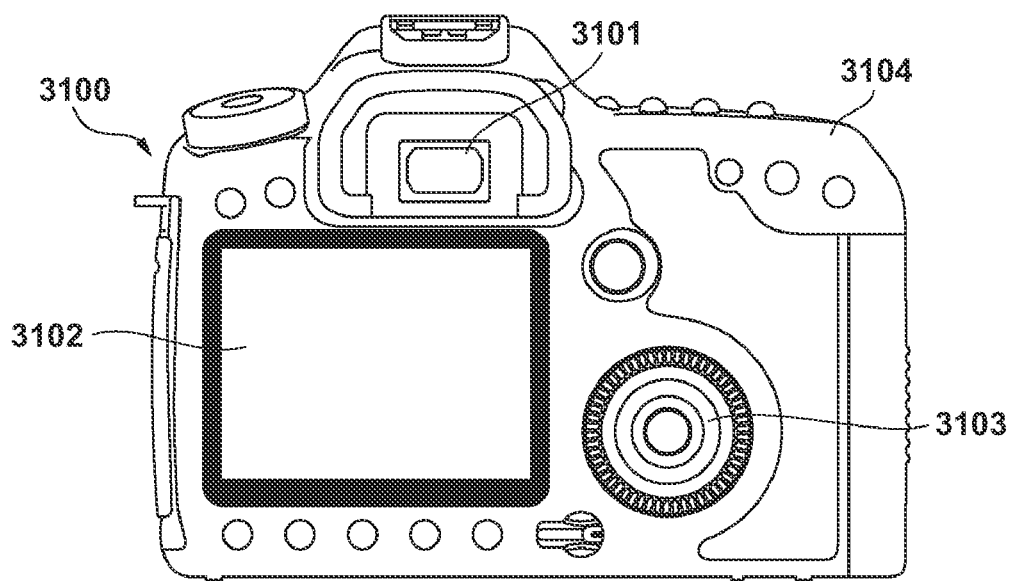
FIG. 33A is a schematic view showing an example of an imaging apparatus.

FIG. 33A is a schematic view showing an example of the imaging apparatus according to this embodiment. An imaging apparatus 3100 can include a viewfinder 3101, a rear display 3102, an operation unit 3103, and a housing 3104. The viewfinder 3101 can include the light emitting apparatus according to the present invention. In this case, the viewfinder 3101 can display not only an image to be captured but also environment information, imaging instructions, and the like. Examples of the environment information are the intensity and direction of external light, the moving velocity of an object, and the possibility that an object will be covered with an obstacle. The rear display 3102 may include the light emitting apparatus.

The timing suitable for imaging is a very short time, so the information is preferably displayed as soon as possible. Therefore, the display apparatus using the organic light-emitting element is preferably used. This is so because the organic light-emitting element has a high response speed. The display apparatus using the organic light-emitting element can be used for the apparatuses that require a high display speed.

The imaging apparatus 3100 includes an optical unit (not shown). This optical unit has a plurality of lenses, and forms an image on an imaging element that is accommodated in the housing 3104. The focal points of the plurality of lenses can be adjusted by adjusting the relative positions. This operation can also automatically be performed. The light emitting apparatus can include a color filter having red, green, and blue. In this color filter, red, green, and blue can be arranged in the form of a delta array. The light emitting apparatus may be used for a display unit of a portable terminal. At this time, the display unit can have both a display function and an operation function. Examples of the portable terminal are a portable phone such as a smartphone, a tablet, and a head mounted display.

Figure 33B:
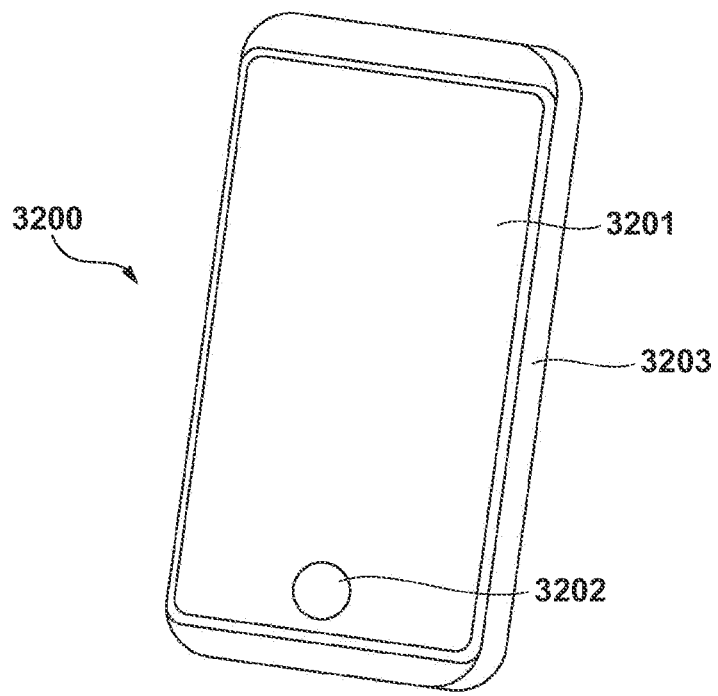
FIG. 33B is a schematic view showing an example of an electronic apparatus.

FIG. 33B is a schematic view showing an example of an electronic apparatus according to this embodiment. An electronic apparatus 3200 includes a display unit 3201, an operation unit 3202, and a housing 3203. The display unit 3201 includes the light emitting apparatus according to the present invention. The housing 3203 can accommodate a circuit, a printed board having this circuit, a battery, and a communication unit. The operation unit 3202 can be a button. The display unit 3201 can be a touch-panel-type reaction unit that allows an operation using the touch panel. The operation unit can also be a biometric authentication unit that performs unlocking or the like by authenticating the fingerprint. The electronic apparatus including the communication unit can also be regarded as a communication apparatus.

Figure 34A:
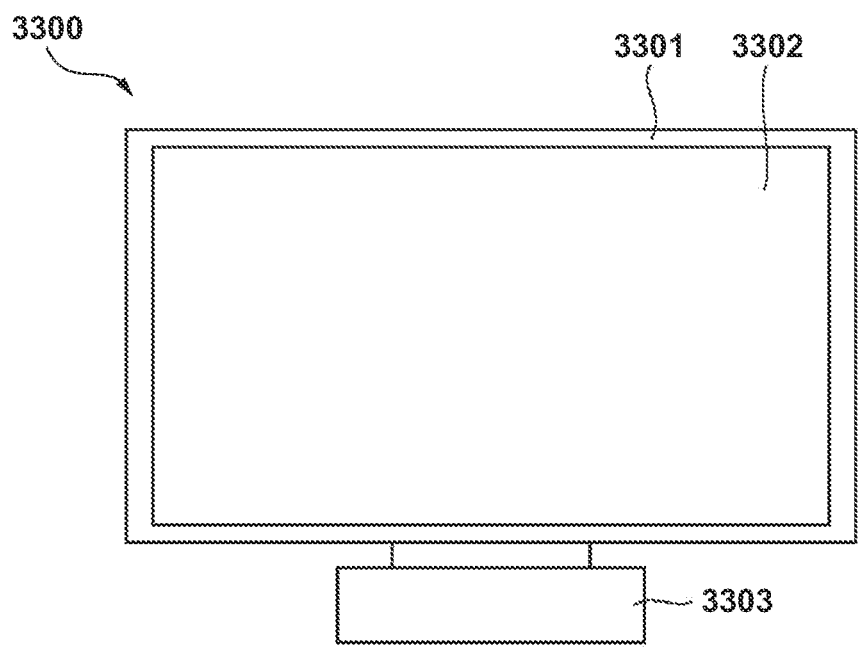
FIG. 34A is a schematic view showing an example of a display apparatus.
Figure 34B:
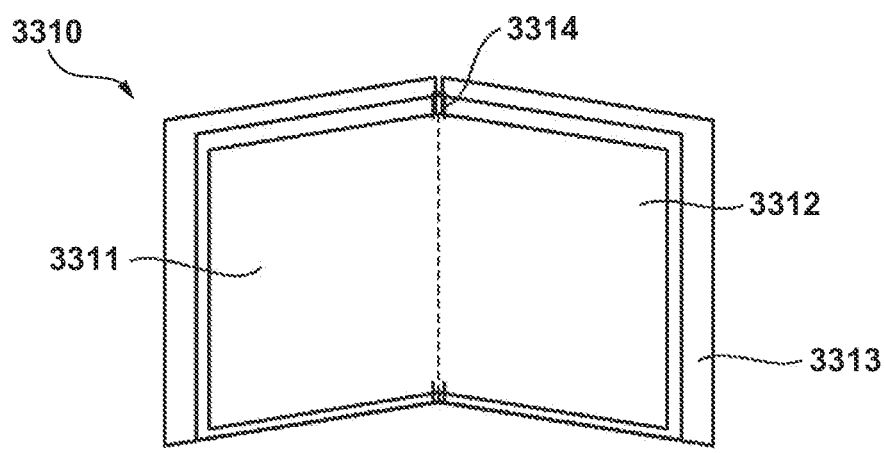
FIG. 34B is a view showing an example of a display apparatus that can be folded.

FIGS. 34A and 34B are schematic views showing examples of the display apparatus according to this embodiment. FIG. 34A shows a display apparatus such as a television monitor or a PC monitor. A display apparatus 3300 includes a frame 3301 and a display unit 3302. The light emitting apparatus according to the present invention can be used for the display unit 3302.

The display apparatus 3300 includes a base 3303 that supports the frame 3301 and the display unit 3302. The base 3303 is not limited to the form shown in FIG. 34A. For example, the lower side of the frame 3301 may also function as the base. In addition, the frame 3301 and the display unit 3302 can be curved. The radius of curvature in this case can be 5,000 (inclusive) to 6,000 (inclusive) mm.

FIG. 34B is a schematic view showing another example of the display apparatus according to this embodiment. A display apparatus 3310 shown in FIG. 34B can be folded, that is, the display apparatus 3310 is a so-called foldable display apparatus. The display apparatus 3310 includes a first display unit 3311, a second display unit 3312, a housing 3313, and a bending point 3314. Each of the first display unit 3311 and the second display unit 3312 can include the light emitting apparatus according to the present invention. The first display unit 3311 and the second display unit 3312 can also be one seamless display apparatus. The first display unit 3311 and the second display unit 3312 can be divided by the bending point. The first display unit 3311 and the second display unit 3312 can display different images, and can also display one image together.

Figure 35A:
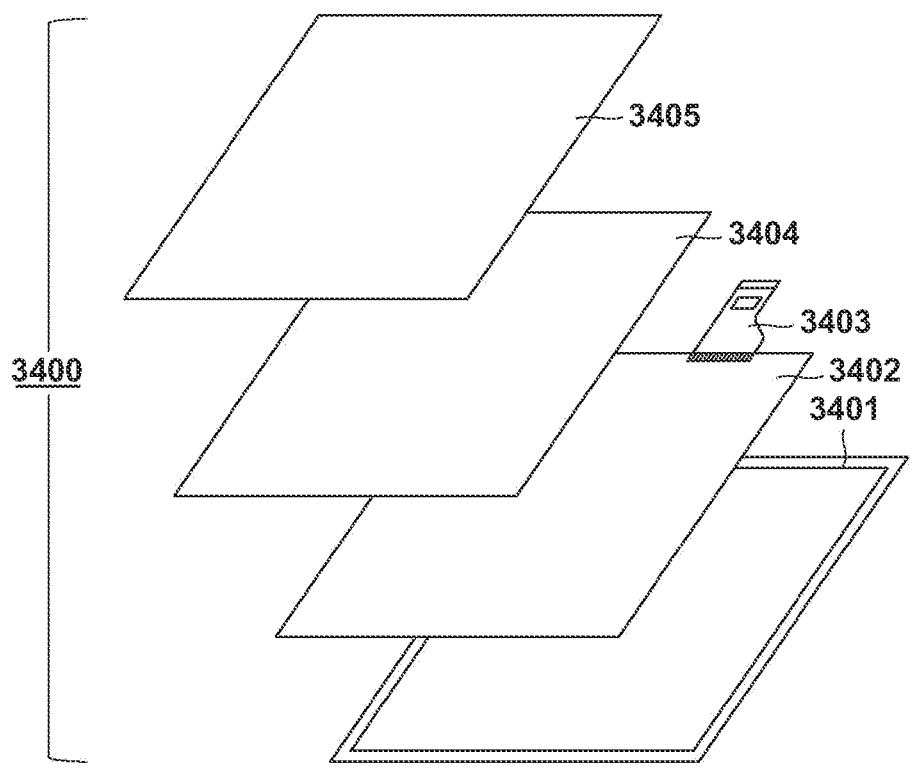
FIG. 35A is a view showing an example of an illumination apparatus using the display apparatus.

FIG. 35A is a schematic view showing an example of the illumination apparatus that uses the characteristics of the light emitting apparatus according to the present invention. An illumination apparatus 3400 can include a housing 3401, a light source 3402, a circuit board 3403, an optical film 3404, and a light-diffusing unit 3405. The light source can include light emitting apparatus according to the present invention. The optical film can be a filter that improves the color rendering property of the light source. When performing lighting-up or the like, the light-diffusing unit can throw the light of the light source over a broad range by transmitting the light and effectively diffusing it. The optical film and the light-diffusing unit can be provided on the illumination light emission side. The illumination apparatus can also include a cover on the outermost portion, as needed.

The illumination apparatus is, for example, an apparatus for illuminating the interior of the room. The illumination apparatus can emit white light, natural white light, or light of any color from blue to red. The illumination apparatus can also include a light control circuit for controlling these light components. The illumination apparatus can also include the light emitting apparatus according to the present invention and a power supply circuit connected to the light emitting apparatus. The power supply circuit is a circuit for converting an AC voltage into a DC voltage. White has a color temperature of 4,200 K, and natural white has a color temperature of 5,000 K. The illumination apparatus may also include a color filter.

In addition, the illumination apparatus according to this embodiment can include a heat radiation unit. The heat radiation unit radiates the internal heat of the apparatus to the outside of the apparatus, and examples are a metal having a high specific heat and liquid silicon.

Figure 35B:
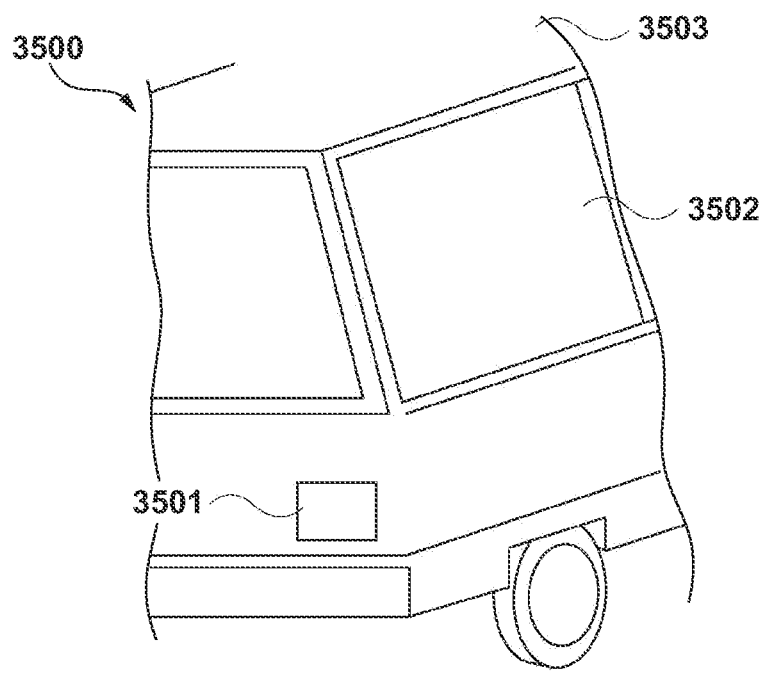
FIG. 35B is a view showing a vehicle lighting appliance using the display apparatus.

FIG. 35B is a schematic view of an automobile as an example of a mobile apparatus using the light emitting apparatus as a lighting appliance according to the present invention. The automobile has a taillight as an example of the lighting appliance. An automobile 3500 has a taillight 3501, and can have a form in which the taillight is turned on when performing a braking operation or the like. The taillight 3501 can include the light emitting apparatus according to the present invention. The taillight can include a protection member for protecting the light emitting apparatus. The material of the protection member is not limited as long as the material is a transparent material with a strength that is high to some extent, and is preferably polycarbonate. A furandicarboxylic acid derivative, an acrylonitrile derivative, or the like may be mixed in polycarbonate.

The automobile 3500 can include a body 3503, and a window 3502 attached to the body 3503. This window can be a window for checking the front and back of the automobile, and can also be a transparent display. This transparent display can include the light emitting apparatus according to this embodiment. In this case, the constituent materials such as the electrodes of the organic light-emitting element are preferably formed by transparent members.

The mobile apparatus according to this embodiment can be a ship, an airplane, a drone, or the like. The mobile apparatus can include a main body and a lighting appliance installed in the main body. The lighting appliance can emit light for making a notification of the position of the main body. The lighting appliance includes the light emitting apparatus according to the present invention.

As described above, according to the present invention, there can be provided a light emitting apparatus that readily implements appropriate white balance. An apparatus using the light emitting apparatus according to the present invention can implement high quality, stable display for a long period, and light emission.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-013812, filed Jan. 30, 2020 which is hereby incorporated by reference herein in its entirety.

What is claimed is:

1. A light emitting apparatus comprising:
a plurality of pixels with different light emitting colors, each of the plurality of pixels including a light-emitting element configured to emit light with one of at least three different light emitting colors;
a driving transistor configured to supply a current to the light-emitting element in accordance with a voltage supplied to a gate of the driving transistor;
a write transistor configured to supply a signal voltage from a signal line to the gate of the driving transistor; and
a capacitor at a connection portion between the driving transistor and the write transistor,
wherein capacitance of the capacitor is different for each light emitting color and is larger in a pixel of a light emitting color in which a peak current flowing through the light-emitting element is larger.

2. The apparatus according to claim 1, wherein the capacitor includes a capacitive element connected to the gate of the driving transistor.

3. The apparatus according to claim 2, wherein the capacitive element is formed by overlapping a wiring connected to at least one of a source and a drain of the driving transistor with the gate of the driving transistor in a planar view.

4. The apparatus according to claim 2, wherein the capacitive element has a MIM (Metal-Insulator-Metal) structure.

5. The apparatus according to claim 1, wherein the capacitor at the connection portion includes a parasitic capacitance of the driving transistor.

6. The apparatus according to claim 1, wherein an impurity density of at least one of a source and a drain of the driving transistor is set for each light emitting color.

7. The apparatus according to claim 1, wherein the driving transistor has a lightly doped drain structure, and a length along a direction in which a current flows in a portion, formed with a lower impurity density, of the lightly doped drain structure is set for each light emitting color.

8. The apparatus according to claim 1, further comprising a capacitive element configured to hold a threshold voltage of the driving transistor when a threshold compensation voltage is supplied to the gate of the driving transistor,
wherein the threshold voltage of the driving transistor is compensated by a threshold voltage held in the capacitive element.

9. The apparatus according to claim 8, wherein the capacitive element has a MIM (Metal-Insulator-Metal) structure.

10. The apparatus according to claim 8, wherein the threshold compensation voltage is set for each light emitting color.

11. The apparatus according to claim 1, wherein a light emission control transistor is further connected between the driving transistor and a power supply.

12. The apparatus according to claim 11, wherein a capacitive element is further connected between a source and a drain of the light emission control transistor, and a value of the capacitive element is set for each light emitting color.

13. The apparatus according to claim 12, wherein the capacitive element has a MIM (Metal-Insulator-Metal) structure.

14. The apparatus according to claim 1, further comprising a reset transistor connected between an anode of the light-emitting element and a reference potential,
wherein the reset transistor is controlled to be ON state during a period in which the light-emitting element is set in a non-light emission state.

15. A light emitting apparatus comprising:
a first light-emitting element; and
a second light-emitting element whose magnitude of a peak current is larger than that of the first light-emitting element,
wherein the first light-emitting element includes (i) a first driving transistor configured to supply a current to the first light-emitting element in accordance with a voltage supplied to a gate of the first driving transistor and (ii) a first capacitor connected to the gate of the first driving transistor,
wherein the second light-emitting element includes (i) a second driving transistor configured to supply a current to the second light-emitting element in accordance with a voltage supplied to a gate of the second driving transistor and (ii) a second capacitor connected to the gate of the second driving transistor, and
wherein the second capacitor has a capacitance value different from a capacitance value of the first capacitor so that the current flowing through the second light-emitting element is larger than the current flowing through the first light-emitting element when the first light-emitting element and the second light-emitting element receive the same luminance signal.

16. The apparatus according to claim 15, wherein the first capacitor includes a capacitive element connected to the gate of the first driving transistor.

17. The apparatus according to claim 15, wherein the first light-emitting element includes a third capacitor connected between the gate of the first driving transistor and a power supply potential,
    wherein the second light-emitting element includes a fourth capacitor connected between the gate of the second driving transistor and the power supply potential, and
    wherein the third capacitor and the fourth capacitance have different capacitance values.

18. An imaging apparatus comprising
an optical unit including a plurality of lenses;
an imaging element configured to receive light having passed through the optical unit; and
a display unit configured to display an image captured by the imaging element,
wherein the display unit includes the light emitting apparatus defined in claim 1.

19. An electronic apparatus comprising:
a display unit including the light emitting apparatus defined in claim 1;
a housing provided with the display unit; and
a communication unit provided in the housing and configured to communicate with an external device.

20. An illumination apparatus comprising:
the light source including the light emitting apparatus defined in claim 1;
at least one of a light-diffusing unit; and
an optical film that transmits light emitted by the light source.

21. A mobile apparatus comprising a lighting appliance including the light emitting apparatus defined in claim 1; and
a main body provided with the lighting appliance.

* * * * *